(12) United States Patent
Iwanczyk et al.

(10) Patent No.: US 7,170,049 B2
(45) Date of Patent: Jan. 30, 2007

(54) PIXELATED CADMIUM ZINC TELLURIDE BASED PHOTON COUNTING MODE DETECTOR

(75) Inventors: Jan S. Iwanczyk, Los Angeles, CA (US); Bradley E. Patt, Sherman Oaks, CA (US); Einar Nygard, Asker (NO)

(73) Assignee: DxRay, Inc., Northridge, CA (US)

( * ) Notice: Subject to any disclaimer, the term of this patent is extended or adjusted under 35 U.S.C. 154(b) by 0 days.

(21) Appl. No.: 11/024,317

(22) Filed: Dec. 28, 2004

(65) Prior Publication Data

US 2005/0139757 A1 Jun. 30, 2005

Related U.S. Application Data

(60) Provisional application No. 60/533,877, filed on Dec. 30, 2003.

(51) Int. Cl.
*H01J 40/14* (2006.01)
(52) U.S. Cl. ..................... 250/239; 250/208.1
(58) Field of Classification Search ............ 250/214 R, 250/239, 208.1, 370.08; 378/62, 63; 348/302, 348/308; 257/432, 443, 444
See application file for complete search history.

(56) References Cited

U.S. PATENT DOCUMENTS 5,665,959 A * 9/1997 Fossum et al. .......... 250/208.1
6,355,939 B1 * 3/2002 Dodd .......................... 257/21

OTHER PUBLICATIONS

International Search Report dated Jul. 6, 2005, Application No. PCT/US04/43784, International Filing Date Dec. 28, 2004; 3 pages.
Written Opinion of the International Searching Authority, dated Jul. 6, 2005, Application No. PCT/US04/43784, International Filing Date Dec. 28, 2004, 4 pages.

* cited by examiner

*Primary Examiner*—Que T. Le
(74) *Attorney, Agent, or Firm*—Christie, Parker & Hale, LLP

(57) ABSTRACT

A radiation detector for detecting radiation such as x-rays. The radiation detector includes a detector having a plurality of pixels, wherein each of the pixels is used for detecting the radiation. The radiation detector also includes a ball grid array (BGA) package having a plurality of solder balls formed on a first side and a plurality of contacts formed on a second side. The BGA package also has a cavity, in which at least one integrated circuit (IC) chip is mounted. The IC chip has a plurality of readout channels, each of the readout channels being coupled to a corresponding one of the pixels via a corresponding one of the solder balls to receive an electrical signal corresponding to the radiation detected by the corresponding one of the pixels.

37 Claims, 14 Drawing Sheets

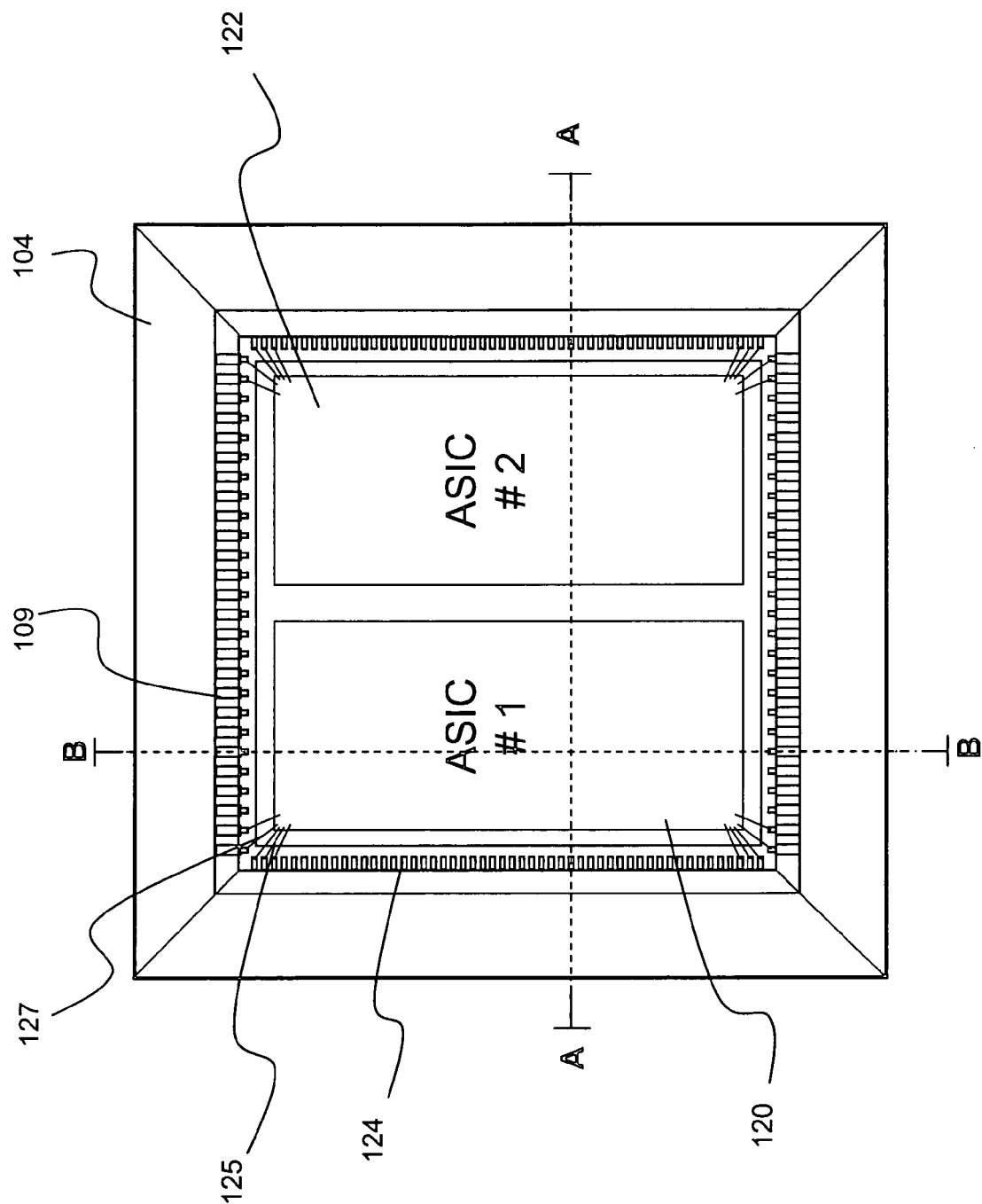

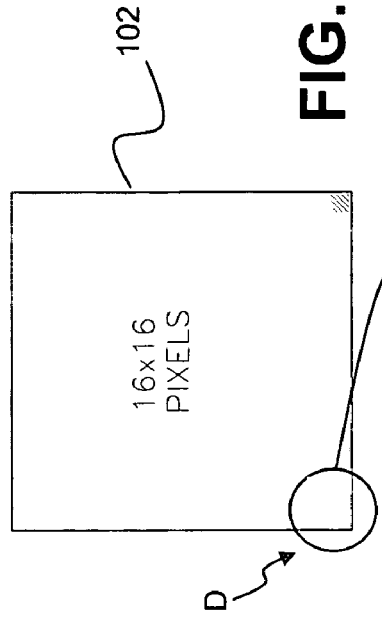
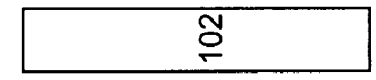
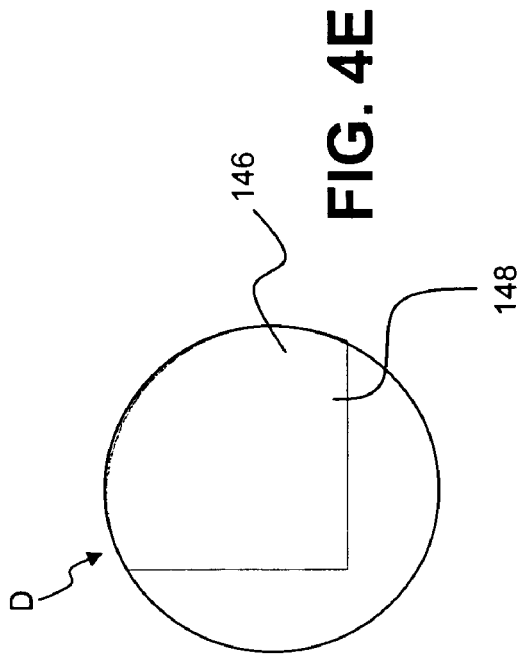
FIG. 4C
FIG. 4E
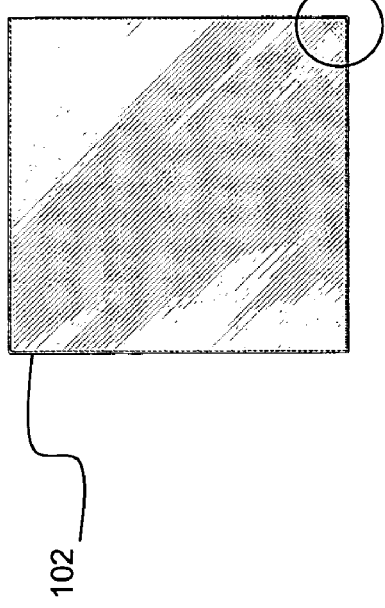
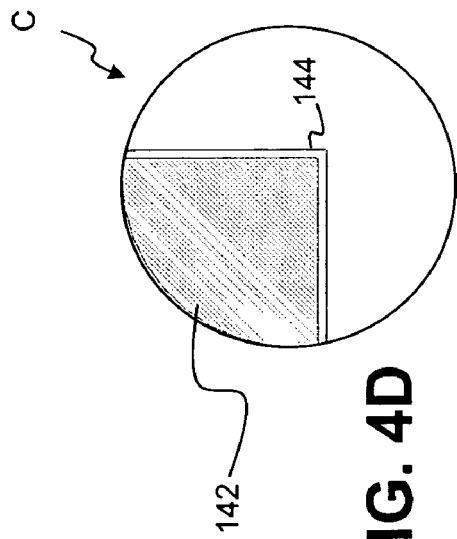
FIG. 4A
FIG. 4B
FIG. 4D

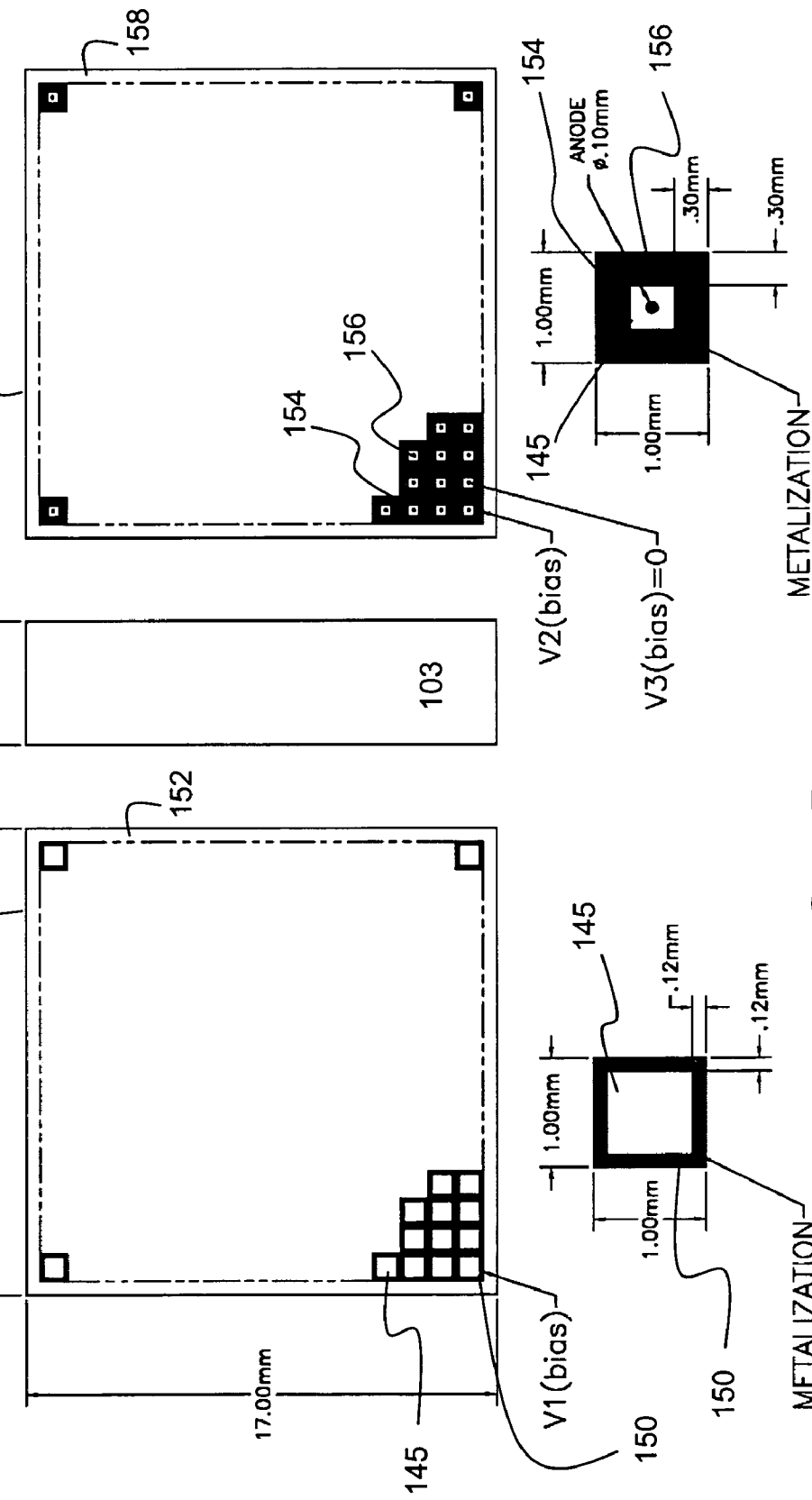

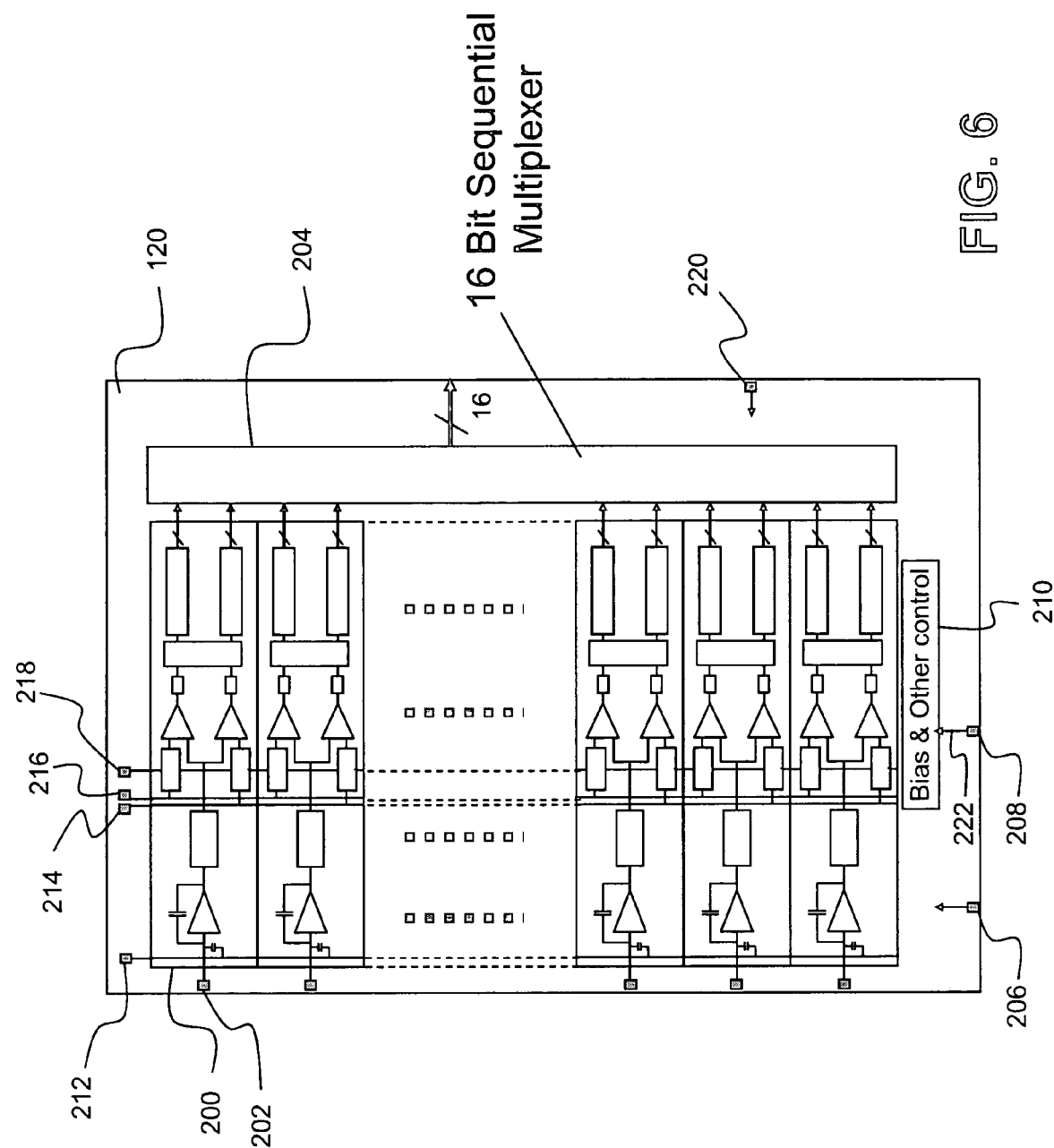

PIXELATED CADMIUM ZINC TELLURIDE BASED PHOTON COUNTING MODE DETECTOR

CROSS-REFERENCE TO RELATED APPLICATION(S)

This application claims priority to and the benefit of U.S. Provisional Patent Application No. 60/533,877 entitled "Pixelated Cadmium Zinc Telluride Based Photon Counting Mode Detector" filed Dec. 30, 2003, the entire content of which is incorporated by reference herein.

FIELD OF THE INVENTION

The present application relates to radiation detectors, and more particularly to a photon counting mode (PCM) detector based on a pixelated cadmium zinc telluride (CZT) detector for Computer Tomography (CT) system applications.

BACKGROUND

Currently available CT systems typically use a detector having silicon (Si) (p-n junction) photodiodes that are optically coupled to a scintillator. A typical size of pixels in the detector is about 1 mm. There is a tremendous dose of x-rays delivered to the detector of about 100 M photons/mm$^2$/second (in the air without the patient). As such high photon flux is currently needed in examinations to obtain required statistics, photon counting detectors are generally not used in clinical CT systems. Hence, the detector is typically operated in an integrating mode where the detector and an x-ray generator are mounted in a continuously rotating gantry.

The use of such high photon flux may be unduly harmful to the patients. Further, the use of integration mode detectors results in generally poorer image quality than could be achieved by counting individual photons.

Therefore, there is a need for a detector that has one or more of, without being limited to, the following characteristics: 1) improved detection capabilities and faster response time to operate in a photon counting mode; 2) improved image quality; 3) spectroscopic capabilities; 4) little or no limitations in the dynamic range; 5) low sensitivity or insensitivity to afterglow; 6) low sensitivity or insensitivity to dark-current noise; and 7) provision for forming a large area, multi-slice detector using multiple detector modules.

SUMMARY

In an exemplary embodiment of the present invention, a radiation detector includes a detector, a ball grid array (BGA) package and at least one integrated circuit (IC) chip. The detector has a plurality of pixels, each of the pixels for detecting radiation. The BGA package has a plurality of solder balls formed on a first side and a plurality of electrical contacts formed on a second side, and has a cavity. The at least one IC chip is mounted in the cavity of the BGA package, and has a plurality of readout channels. Each of the readout channels is coupled to a corresponding one of the pixels via a corresponding one of the solder balls to receive an electrical signal corresponding to the radiation detected by the corresponding one of the pixels.

In another exemplary embodiment of the present invention, a radiation detecting and processing method using a radiation detector is provided. The radiation detector includes a detector having a plurality of pixels, a ball grid array (BGA) package having a plurality of solder balls formed on one side and a plurality of electrical contacts formed on the other side, and at least one IC chip having a plurality of readout channels and mounted in a cavity of the BGA package. Radiation is detected in each of the pixels of the detector. Electrical signals are induced in the readout electronic channels in response to the radiation. Electrical connections are provided between the pixels and the readout channels of the at least one IC chip via the solder balls, each of the readout channels processing the electrical signals corresponding to one of the pixels. Information concerning the radiation detected in the pixels is provided to a PCB through the electrical contacts.

In yet another exemplary embodiment of the present invention, a PCM detector for detecting and counting photons is provided. The PCM detector includes a detector having a plurality of pixels. The speed of counting the photons is improved through a small pixel effect. The PCM detector also includes at least one IC chip, each having a plurality of readout channels. Each of the readout channels is coupled to a corresponding one of the pixels. A chip package for mounting the at least one IC chip includes a plurality of electrical contacts for electrically coupling the at least one IC chip to the pixels.

The PCM detector may be a pixelated CZT detector, which utilizes the small pixel effect. The radiation generates free charges (electron and holes) in the detector. The small pixel effect allows for obtaining the detection signal faster than the drift time (which typically defines the response time) of the liberated charges by the ionization process in the detector.

In yet another exemplary embodiment of the present invention, a drift structure is provided for each pixel of a pixelated CZT detector. Using the drift structure, of the pixelated CZT detector the duration of the detection signal can be further reduced.

In yet another exemplary embodiment of the present invention, CMOS readout circuitry is implemented on one or more ASIC chips. The ASIC chips have a number of readout channels that correspond with the number of pixels on the pixelated CZT detector. Using the CMOS technology, charge-sensitive preamplifier, shaping amplifier, multiple energy level discriminators, and digital event counters, for each pixel in the array, are all formed within each pixel's geometric area.

In yet another exemplary embodiment of the present invention, in a PCM detector, one or more ASIC chips including readout circuitry are mounted within a cavity of a ball grid array (BGA) package. The solder balls of the BGA package are used to electrically connect the corresponding pixels of the pixelated CZT detector. Electrical contacts are formed on a top surface of the BGA package for input/output (I/O) and power interfaces with external devices (e.g., the printed circuit board (PCB) on which the PCM detector is mounted).

In yet another exemplary embodiment of the present invention, the solder balls are electrically coupled to the pixels through via holes on a ceramic or fiber glass PCB or via board. The via board may be attached to the pixelated CZT detector using electrically conductive polymer. The ASIC chip including readout circuitry are flip-chip mounted within the cavity of the BGA package. Optionally, the ASIC chip may be protected using glob applied within the cavity on top of the ASIC chip.

BRIEF DESCRIPTION OF THE DRAWINGS

These and other aspects of the invention may be understood by reference to the following detailed description, taken in conjunction with the accompanying drawings, wherein:

FIG. 2 is a top view of a double-sided ball grid array of the PCM detector of FIG. 1;

FIGS. 4A–4E illustrate top, side, and bottom views of a CZT detector in an exemplary embodiment of the present invention;

FIGS. 5A–5E illustrate top, side and bottom views of a CZT detector in another exemplary embodiment of the present invention;

FIG. 6 is a schematic diagram of readout circuitry having 128 channels, implemented on an ASIC;

DETAILED DESCRIPTION

Figure 1:
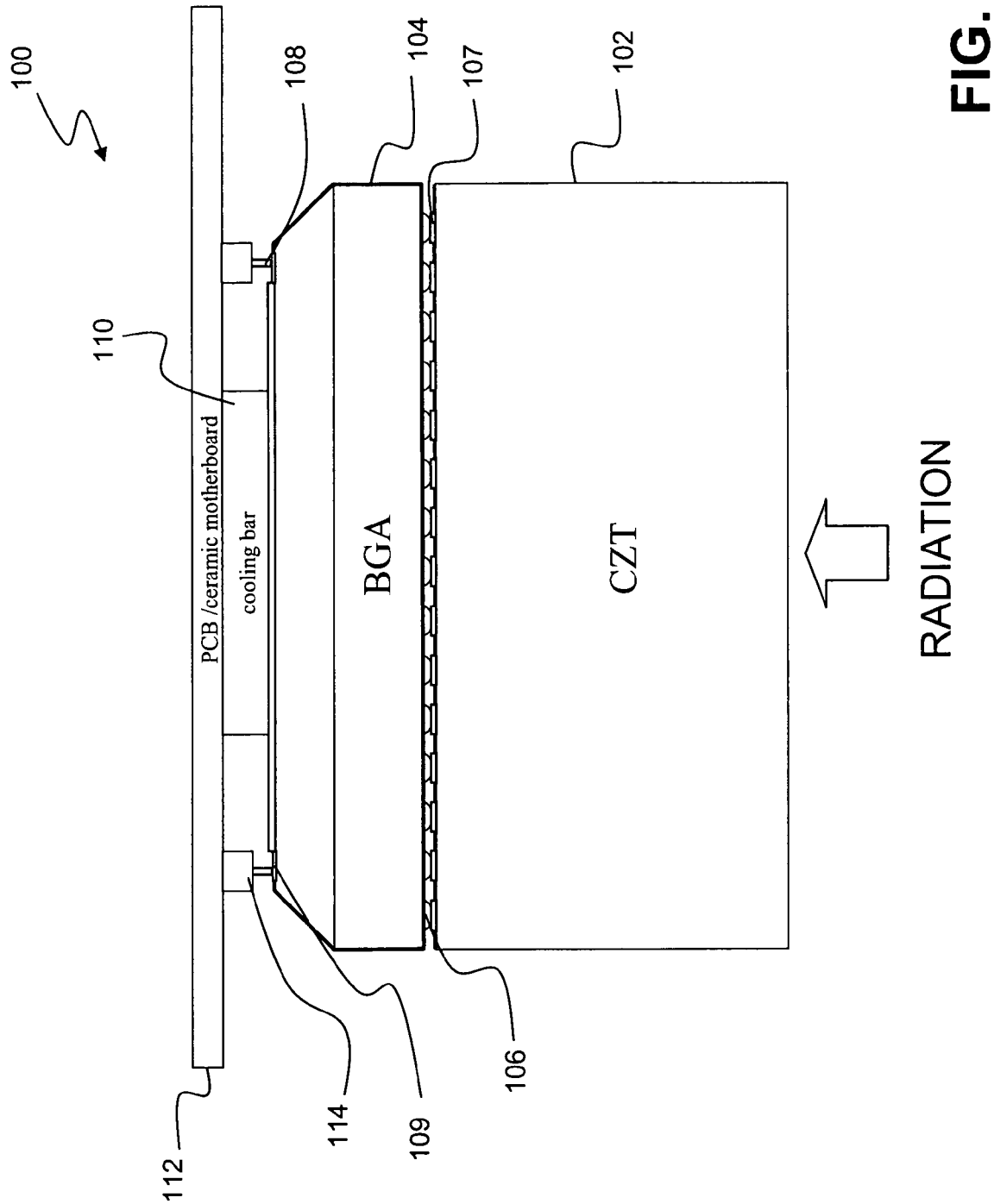
FIG. 1 is a schematic diagram of a PCM detector in an exemplary embodiment of the present invention.

In exemplary embodiments of the present invention, a high-sensitivity, photon-counting direct-conversion x-ray detector ("photon (or pulse) counting mode (PCM) detector") for CT is provided. By combining a high-sensitivity detector material, namely, a pixelated cadmium zinc telluride (CdZnTe, a.k.a, CZT) detector, with CMOS technology photon-counting readouts, an improved x-ray detector performance is achieved. The CZT detector is a direct conversion sensor for converting x-rays to electrical signals.

The output counting rate per pixel is typically several MHz, meaning that each pixel will detect several million photons per second. Each pixel, for example, is coupled to two associated 16–20 bit counters for local (digital) integration and storage of electrical signals corresponding to the detected photons prior to a high speed readout.

In one exemplary embodiment, to implement a pixel by pixel interface between the pixelated detector and the readout electronics, one or more ASIC chips containing the readout electronics are implemented in a novel and unobvious double-sided ball grid array (double-sided BGA) in the PCM detector. The double-sided BGA is double-sided in a sense that it has electrical contacts on both top and bottom sides unlike conventional BGAs. Such double-sided BGA may be referred to herein as a BGA, double-sided ball grid array, or a double-sided BGA package.

By way of example, the electrical contacts on one side (top or bottom side depending on the reference point of view) includes a plurality of solder balls for interfacing with the pixels. These solder balls are coupled via internal wires (in the BGA package) to the one or more ASIC chips. The electrical contacts on the other side of the BGA package is used for electrical connection between the one or more ASIC chips external devices, such as, for example, ceramic or fiber glass PCB or motherboard, and includes any suitable types of electrical contacts such as sockets, pins, solder balls, etc.

In another exemplary embodiment of the present invention, an ability to count only those individual x-rays which fall into one or more prescribed energy windows (or bins) is provided. Such ability to count photons having certain energy levels gives substantial performance advantages over old technology x-ray detectors where the total charge generated by all of the x-rays hitting a pixel (analog integrating mode) is the only signal available. For example, the lowest threshold for detection may be less than 30 kilo electron volts (keV) with discrimination of two or more bins.

In another exemplary embodiment of the present invention, by virtue of photon counting instead of signal integration, the signal to noise ratio is improved by removing the dark current and readout circuitry noise. Further, the dose of radiation delivered can be reduced since the detector of the present invention can count individual photons and measure the corresponding energy, and thereby gather more information per photon detected.

With the ability to perform photon counting on a per pixel basis, the CT systems built using the exemplary embodiments of the present invention are significantly more immune to electronic noise than the traditional analog integrating mode detector systems. Because the analog integration mode does not allow separation between signal and noise, thermal and shot noise are intrinsic problems with those detectors. With photon counting, threshold circuitry can be applied which effectively requires that each photon's signal be high enough to overcome the thermal and other noise floor in the device. This effectively reduces or eliminates the contribution of electronic noise to the signal.

Energy integration is a victim of second order noise processes because of at least the following reasons. First, because a polyenergetic x-ray spectrum is used, each detected photon contributes a different amount of energy to the image. This leads to an increase in the noise variance of the final image. Second, the interaction of photons of the same energies does not always result in the same amount of signal energy being deposited, because of secondary processes such as Compton and Rayleigh scattering and photoelectric reemission (x-ray fluorescence).

On the other hand, photon counting detector systems are much less affected by such second order noise processes. For example, the photon counting mode detectors of the present invention significantly outperform conventional systems by providing DQE (i.e., quantum efficiency) of approximately 1 (i.e., each x-ray photon is counted), which in turn can allow for reducing radiation dose to patients and/or increase contrast. In addition, spectroscopic information enhances the image quality by taking into account the energy of individual photons and their attenuation in different density tissue.

Referring now to FIG. 1, a PCM detector 100 includes a CZT detector 102, which may have 16×16 pixels, for example, for pixelated detection of radiation (e.g., x-rays). The CZT detectors in other embodiments may have a different number of pixels. The CZT detector is a high-Z large band gap compound semiconductor. Because the CZT material has outstanding charge collection properties, it is used for photon counting in described exemplary embodiments of the present invention. Other suitable detector materials having similar properties may be used in other embodiments.

In other exemplary embodiments, the PCM detector may include more than one two-dimensional detector array modules made of CZT. For example, each module of detector arrays may have 256 pixels (16×16) with the inter-pixel pitch of 0.3 to 3 mm. A number of such detector array modules may be arranged in an array to increase the size of the detector. In other embodiments, each individual detector array module may have a different number of pixels.

The pixelated CZT detector is constructed to provide a "small" pixel effect, which allows to get the signal much faster than the drift time (which typically defines the response time) of the charges in the detector. Hence, the small pixel effect enhances the detector operation to provide faster response to radiation.

Each pixel of the CZT detector 102 is coupled to a corresponding one of the solder balls (recipient electrode) 106 of a double-sided BGA 104 via a corresponding one of the CZT electrodes 107. The CZT electrodes 107 may be formed of conductive epoxy, for example, or any other suitable material. The double-sided BGA 104 has one or more ASICs mounted therein. The ASICs include channels containing readout circuitry for each pixel of the CZT detector 102.

In the illustrated exemplary embodiment, since all of the balls 106 at the bottom side of the double-sided BGA 104 are used to interface with the pixels of the CZT detector 102, a number of contacts 109 are formed on the top side of the double-sided BGA 104 for interfacing with a PCB 112, which may be a ceramic motherboard. Pins 108 are mounted on the contacts 109 for electrically coupling with the connectors 114 that are mounted on the PCB 112.

The contacts 109 are formed on the double-sided BGA 104 as a pair of parallel rows of contacts on the side opposite the side where the solder balls are mounted. Similarly, the pair of connectors 114 are placed parallel to each other on the PCB 112. The pins 108 are aligned with sockets of the connectors 114. The pins 108 in other embodiments may be mounted on the PCB 112, and corresponding sockets may be electrically coupled to the contacts 109.

A cooling bar 110 may also be provided between the double-sided BGA 104 and the PCB 112 to dissipate heat generated by the ASICs, for example. The cooling bar 110, for example, may include a commonly available heat sink.

Referring now to FIG. 2, the double-sided BGA 104 has mounted therein a pair of ASIC chips 120 and 122. The readout circuitry implemented in the ASIC chips 120 and 122, which are based on CMOS technology, allows for placing one or more of a charge-sensitive preamplifier, shaping amplifier, multiple energy level discriminators, and digital event counters for each pixel in the array, all within each pixel's geometric area. By incorporating the detector and photon counting electronics in each pixel of the detector system, high photon rates typical of clinical applications can be handled.

Each of the ASIC chips 120 and 122 has formed thereon 128 channels of readout circuitry such that two ASIC chips together can provide readout circuitry to each of the 256 (i.e., 16×16) pixels of the CZT detector 102 of FIG. 1. In other embodiments, all 256 channels of the readout circuitry may be formed on a single ASIC chip. In still other embodiments, different number of channels may be formed on one or more ASIC chips to accommodate a CZT and/or other suitable PCM detector material having different number (e.g., 1024) of pixels.

By way of example, the dimensions of the double-sided BGA 104 in the illustrated exemplary embodiment can be approximately 16 mm by 16 mm. Also, each of the ASIC chips can be approximately 10 mm in length, and be mounted on the double-sided BGA 104. The total width of the area occupied by the ASIC chips including the space therebetween is also approximately 10 mm. In other embodiments, the double-sided BGA and/or the ASIC chips may have different dimensions.

The solder balls 106 are electrically coupled to the readout circuitry on the ASIC chips 120, 122 via wires 125 that may have been formed, for example, using a wire bonding technique, and bonding pins 124. The wire-bond pitch between the bonding pins 124, for example, may be approximately 75 μm. In the described embodiment, the double-sided BGA 104 has 128 bonding pins 124 formed along two opposing inner edges on the top surface of the double-sided BGA 104 for connecting with the 256 solder balls 106. Therefore, the electrical detection signals generated by the CZT detector 102 are provided to the ASICs 120, 122 through the solder balls 106 for processing in the readout circuitry.

In the described exemplary embodiment, the CZT detector 102 and front-end electronics (including the readout circuitry) are integral part of the detection system. In more detail, the front-end electronics and the CZT detector 102 are part of the same electronic circuit for the induced current that flows in after photon interaction occurs in the detector. The front-end electronics provides bias voltage to the detector in this embodiment. Under influence of the electric field created by this bias, the ionized charges (electrons-holes) flow to the respective electrodes. At the same time, the flowing charges induce a flow of a current in the readout electronics. When the ionized charges reach the respective electrodes of the detector, the whole process of generating the signal is finished.

The two rows of contacts 109 formed on opposing inner edges of the top surface of the double-sided BGA 104 are connected to the ASIC chips 120 and 122 via wires 127 that may also have been formed, for example, using a wire bonding technique. Since all of the 256 solder balls 106 are used to interface with the pixels of the CZT detector 102 in the illustrated exemplary embodiment, the wires 127 carry the signals between the ASICS 120 and 122 and external interfaces (I/O, power, etc.) via the contacts 109, pins 108 and the connectors 114. The wire-bond pitch between the contacts 109, for example, may be approximately 250 μm.

Figure 3A:
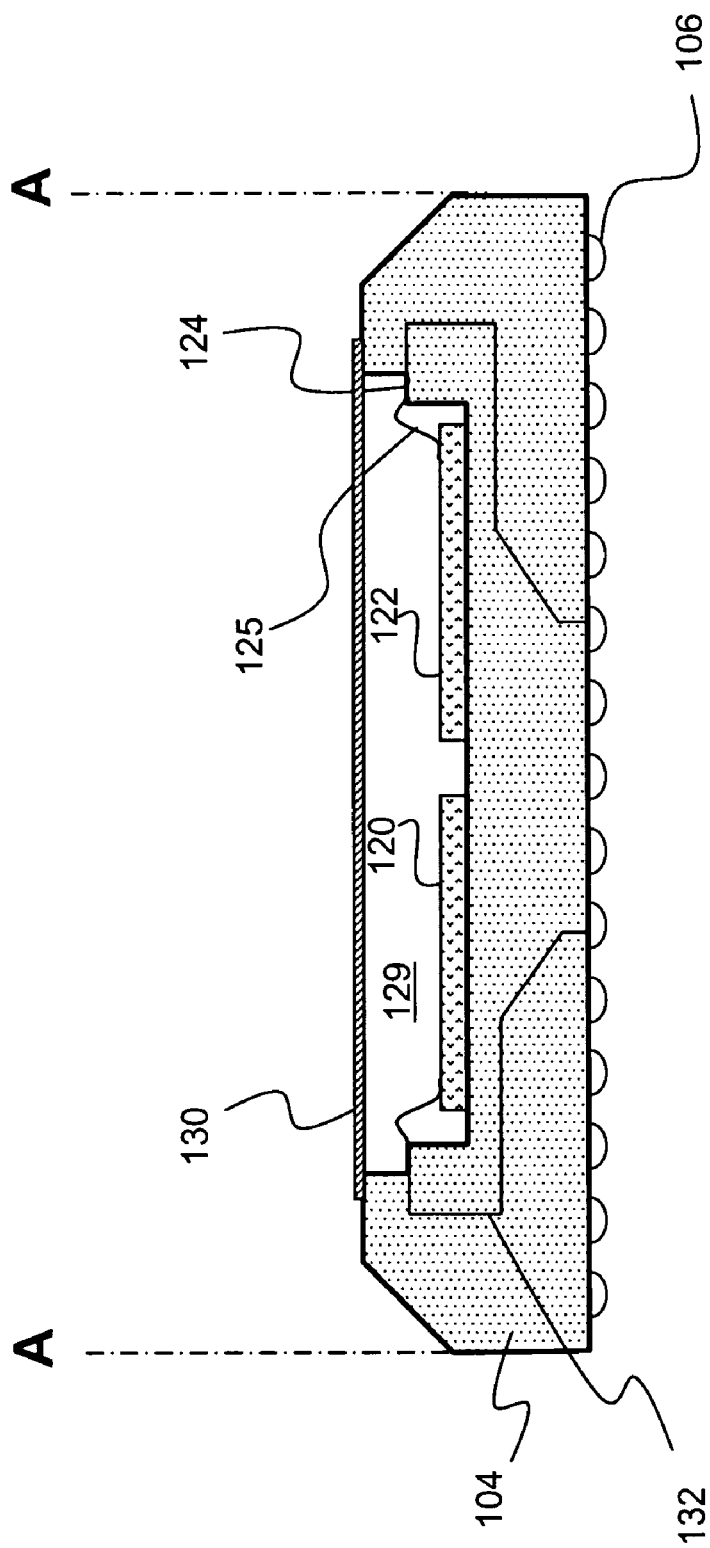
FIG. 3A is a cross-sectional view of the double-sided ball grid array of FIG. 2, taken along the line A—A.

Referring now to FIG. 3A, the double-sided BGA 104 has a cavity 129 surrounded by the inner edges of the double sided BGA for mounting therein the ASIC chips 120 and 122. The cavity 129 is covered by a lid 130, which for example, may be made of plastic, ceramic or other suitable material. Internal wirings 132 are used to electrically couple the solder balls 106 to the readout circuitry on the ASIC chips 120, 122 via the bonding pins 124 and the wires 125.

Figure 3B:
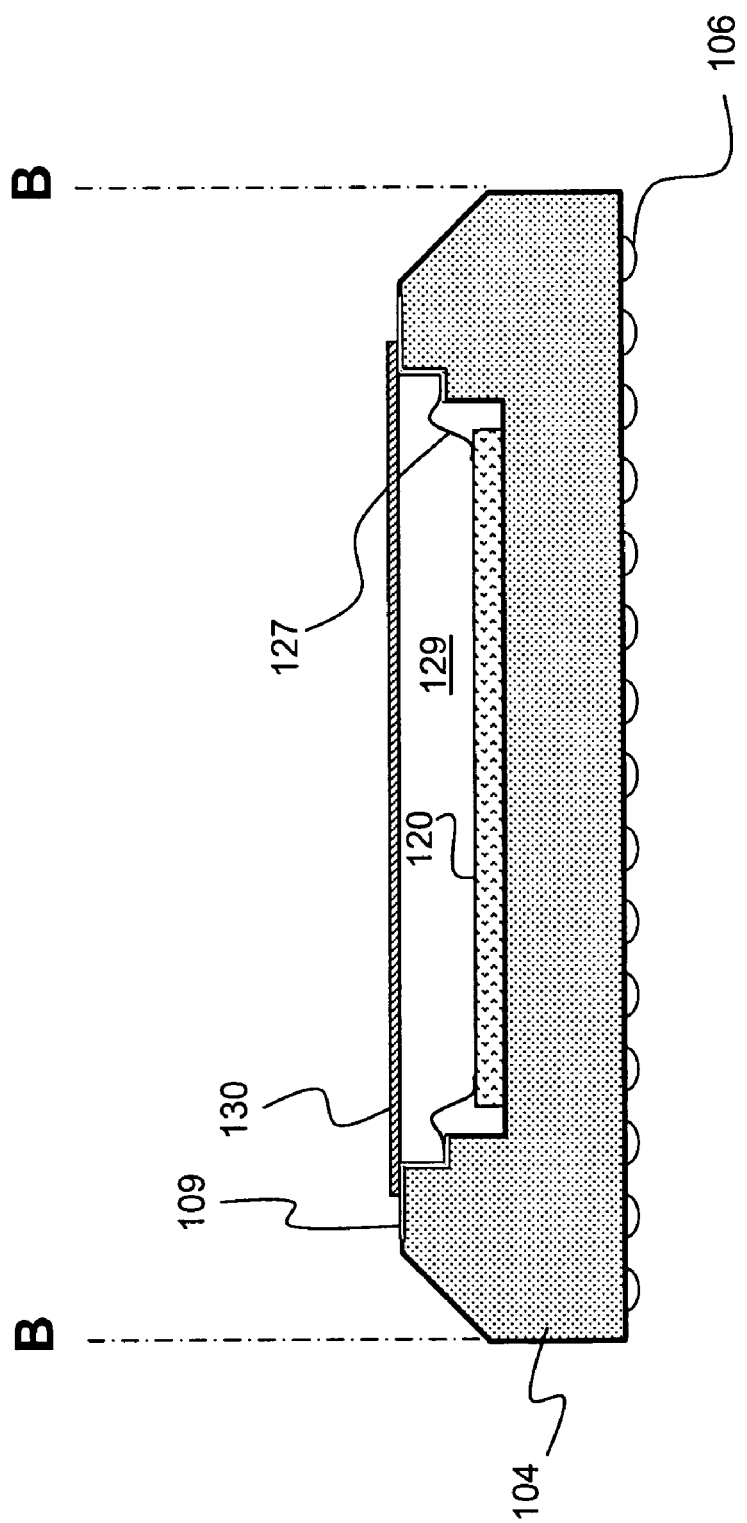
FIG. 3B is a cross-sectional view of the double-sided ball grid array of FIG. 2, taken along the line B—B.

It can be seen in FIG. 3B that the contacts 109, which are coupled to the ASIC chip 120 via the wires 127, are used as connection points for external interfaces. While the ASIC chip 122 is not shown in FIG. 3B, the ASIC chip 122 makes substantially the same connections with the external interfaces as the ASIC chip 120. By way of example, in the described embodiment, the distance between the centers of two adjacent solder balls is approximately 1 mm so that the solder balls are aligned with the 1 mm pixels of the CZT detector. The pixels of the CZT detector in other embodiments may have a different size and the solder balls may be spaced differently corresponding to the size of the pixels. Further, a pitch adapter board may be used between the CZT detector and the double-sided BGA when the pitch of the solder balls of the double-sided BGA is different from that of the pixels of the CZT detector.

FIGS. 4A–4C illustrate a top view, a side view and a bottom view, respectively, of the CZT detector 102. The CZT detector 102 is formed as a monolithic array of 16×16 pixels 140. By way of example, the size of the CZT detector 102 may be approximately 16 mm by 16 mm, and the thickness of the CZT detector 102 may be approximately 3.00 mm. It can be seen in FIG. 4D, which is a detailed illustration of a circle C of FIG. 4A, that each peripheral edge of the CZT detector is occupied by a relatively narrow non-pixelated area 144, which may have a width of approximately 0.10 mm, for example. The entire surface of the entrance window 142 for receiving radiation is metalized. This metal is very thin and is essentially transparent to the x-rays.

Referring now to FIG. 4E, which illustrates a detailed illustration of a circle D of FIG. 4C, on the back side a number of pixels are defined by substantially square metalized contacts 146 that are separated by rows and columns of non-metalized linear areas 148. For example, the non-metalized linear areas 148 may have a substantially uniform width of approximately 0.1 mm.

The metalized contacts 146, for example, interface with the solder balls of the double-sided BGA to provide the detection signals to the readout electronics on the ASIC chips 120 and 122. The metalized area on each pixel, for example, may be approximately 0.9 mm by approximately 0.9 mm, such that the distance between adjacent metalized area is approximately 0.1 mm. The edge pixels may be made slightly smaller than the central pixels to keep the overall pixel pitch substantially constant if several modules are juxtaposed in an array. The metalized areas of the pixels make contacts with the corresponding solder balls.

The CZT detector 102 in one exemplary embodiment has the following properties:

Charge Collection:

| | |
|---|---|
| Electron Mobility [cm$^2$/Vs] | 1350 |
| Hole Mobility [cm$^2$/Vs] | 120 |
| Electron lifetime [s] | 2 × 10$^{-6}$ |
| Hole lifetime [s] | 1 × 10$^{-7}$ |

Transit Time:

| Detector Thickness [cm] | Electron Transit Time* [ns] |
|---|---|
| 0.5 | 185 |
| 0.4 | 119 |
| 0.3 | 67 |
| 0.2 | 30 |
| 0.1 | 7.4 |

*Calculated for V = 1000 V
$T_e = W^2/Vu_e$ where: 1) $T_e$ is Electron Transit Time; 2) W is Detector Thickness; 3) V is Detector Bias Voltage; and 4) $u_e$ is Electron Mobility.

Leakage Current:

Material resistivity ρ [Ohm-cm] is $1\times10^{10}$ to $5\times10^{11}$, where ρ=V A/I W, where: 1) A is Pixel Area; and 2) I is Pixel Leakage Current. For example, I=3.3 nA when V=1000V; W=3 mm, A=1 mm$^2$; and ρ=$1\times10^{10}$ Ohm-cm Capacitance:

C[pF]=78 A[mm$^2$]/W[um]

For example, C=0.03 pF when W=3 mm; and A=1 mm$^2$

Small Pixel Effect:

The induced charge Q on pixel electrodes can be calculated by making use of Shockley-Ramo Theorem: Q=q Δ $\Phi_0$, where: q is a charge of electron; and $\Phi_0$ is weighting potential as a function of the carrier position.

By solving the above equation, it is possible to precisely find the induced charges as a function of the transit time. For the sake of simplicity, the following rules of thumb may be used for approximation. First, the highest energy resolution is achieved when L/W is approximately 0.3, where L is the size (i.e., length or width) of the pixel electrode. Second, most of the generated signal occurs near the anode (pixel electrode) within a distance which is roughly equal to the size of the pixel electrode.

Hence, for example, for a detector with approximately 3 mm thickness and approximately 1 mm pixel size, the majority of signal should be generated within 22 ns. This may allow for setting shaping time of the amplifier as short as 22 ns×1.5=33 ns.

The CZT detector may have a modular configuration, in which an array of CZT detectors 102 are tiled (together with the corresponding ASICs) to form a PCM detector having a multiple of 256 pixels. In order to keep the same pitch for all pixels in such a PCM detector, the CZT detectors may be made to have dimensions of approximately 16 mm×16 mm each, and the edge pixels may have slightly smaller size to accommodate a gap between the individual dies. Further, the dies and metalization of the pixelated electrodes may be fabricated to accommodate a conductive polymer assembly process with ASIC electronic readout. The polymer adhesive approach offers a low temperature (e.g., below 100 degrees Celsius), low cost and high reliability process.

The table below summarizes the main design parameters of the CZT detector in an exemplary embodiment of the present invention. Some of the parameters have been derived using the above described properties of the CZT material. Of course, the values below are exemplary values, and the CZT detectors in other embodiments may have other suitable design parameters.

| Parameter | Value | | Comment |
|---|---|---|---|
| | Typical | Max | |
| Material (high res) | 1E10 Ohm-cm | 5E11 Ohm-cm | CZT spectroscopy grade |
| Die size | 15.9 × 15.9 mm | 16.1 × 16.1 mm | |
| Pixel size | 0.9 × 0.9 mm | 1 × 1 mm | |
| Interpixel separation | 0.1 mm | | 0.1 mm to the edge |
| Thickness | 3 mm | | |
| HV bias | 800 V | 1500 V | |
| Pixel dark current | <5 nA | 50 nA | No x-rays |
| Pixel DC total current | <7 | 60 nA | With x-rays |
| Pixel capacitance | <1 pF | | |
| 80% of signal rise-time | 22 ns | | Prop.delay Ok |
| X-Ray Detection Eff. | >99% | | At 80 keV |
| Assembly to ASIC | Conductive Polymer | | |

In order to assure good detection efficiency up to 140 keV, the thickness of the detector should be between approximately 3 mm and 5 mm. Maximum voltage that can be applied to the detector may be more than 1000V. In this case, the electron transit time, for example, can be 250 ns. The long drift time may be a limiting factor in fast count rate applications. In photon counting mode, a count rate as fast as 100 M counts/s/mm$^2$ is desired. However, a count rate of 10 M counts/s/mm$^2$ may be sufficient in exemplary embodiments of the present invention. This imposes requirement of more than an order of magnitude faster response (10 ns) than the transit time.

In another exemplary embodiment of the present invention, drift structure is introduced. Using the drift structure, the detection signal is induced in the external circuit when electron cloud is close to the collecting anode independent of the actual drift time within the detector. Because of the array structure and interconnect to the readout ASIC chip(s), it is desirable to make drift structure as simple as possible with a minimum number of electrodes requiring biasing. This is also desirable from processing point of view because it is difficult to integrate into CZT structures such features as bias ladder dividers that are commonly used in silicon. For example, the response time of the pixelated CZT detector may be approximately 20 ns using the small pixel effect. That response time may be improved by a factor of 2 to 4 when the drift structure is used.

FIGS. 5A–5C illustrate a top view, a side view and a bottom view of a CZT detector 103 in another exemplary embodiment of the present invention. The CZT detector 103 may replace the CZT detector 102 in the PCM detector 100. The CZT detector 103 uses a drift structure to obtain a faster response time.

An entrance window (i.e., front side) electrode 150 is common to all pixels. It can be seen in FIG. 5D that each pixel 145 is surrounded by a metal trace around its periphery. The metal traces are interconnected together to form the entrance window electrode 150. In operation, the entrance window electrode is biased, for example, with a voltage between approximately −500 volts and approximately −2,000 volts. In one specific embodiment, the voltage applied to the entrance window electrode is approximately −1,000 volts.

Each pixel is substantially square shaped in the illustrated exemplary embodiment. The shape of the pixels may be rectangular or other suitable shape in other exemplary embodiments. The dimensions of each pixel is approximately 1 mm by approximately 1 mm. The width of the metal trace is substantially uniform and is approximately 0.12 mm. The dimensions of the pixels and/or the width of the metal trace may be different in other embodiments. For example, the dimensions of each pixel may be approximately 0.5 mm by approximately 0.5 mm in other exemplary embodiments.

It can be seen in FIG. 5B that the thickness of the CZT detector 102 is between approximately 4 mm to approximately 5 mm. In other embodiments, the thickness may be more than 5 mm or less than 4 mm. As can be seen in FIG. 5A, the CZT detector 102 has a periphery 152 that surrounds the pixelated region and is not occupied by any of the pixels. Because of the periphery 152, the width and length of the CZT detector 102 are approximately 17 mm each. The periphery is also shown on the back side as a periphery 158. In other embodiments, such periphery may not be present or may be very narrow in width.

As shown in FIGS. 5C and 5E, the back side of the CZT detector has formed thereon a network of metallic traces 154. The arraying is implemented on the backside of the die. The pitch between the pixels is approximately 1 mm. Each of the pixels is surrounded by a metallic trace 154. The metallic traces 154 are interconnected with one another to form a back side electrode 154. The width of the metallic trace on the back side electrode is approximately 0.30 mm in the illustrated exemplary embodiment. The width of the metallic traces may be different in other embodiments. In operation, the back side electrode is biased with a voltage between, for example, approximately −10 volts and approximately −300 volts. In a specific exemplary embodiment, the voltage bias is approximately −15 volts.

At about the center of each pixel is formed thereon an anode (pixel electrode) 156. The anode 156 is substantially circular in shape, and has a diameter of approximately 0.10 mm. The anodes 156 are biased with the voltage of approximately 0 volts, which is virtual ground. In other embodiments, the voltage applied to the anodes may be different from 0 volts. By biasing the entrance window electrode 150, the back side electrode 154 and the anodes 156 with suitable voltages, a drift structure is created for each pixel on the CZT detector 102.

Referring now to FIG. 6, the ASIC chip 120 includes 128 channels such that it can, together with the ASIC chip 122, support the CZT detector having 256 pixels. While only the ASIC chip 120 is illustrated in FIG. 6, the ASIC chips 120 and 122 have substantially the same architecture. Hence, the description will be provided herein with respect to the ASIC chip 120 only.

It can be seen in FIG. 6 that a channel 200 for readout is repeated a number of times in a parallel configuration. In fact, the ASIC chip 120 includes 128 of the channels 200 in parallel. Each of the channels 200 has an input 202 for receiving detection signals from the corresponding pixel of the CZT detector 102 (or one of the CZT detectors 103, 318 (see FIG. 10) and 402 (see FIG. 11)).

The ASIC chip 120, for example, may be made using 0.24 μm IBM 6 sf CMOS process and have 128 parallel channels, each corresponding to the readout chain of one pixel and may be made with the lowest possible noise and power consumption while maintaining sufficiently high gain. The pulse shape may be bipolar to maintain optimal count rate and baseline-stability properties. The shape of the pulse may not be ideal bipolar. Provisions are made for dual window energy-binning (semi-spectroscopy). The low bin, for example, may have energy of approximately 20 keV to approximately 70 keV, whereas the high bin may have energy of approximately 70 keV to approximately 140 keV. The ASIC chips in other embodiments may have more than two (e.g., four) window bins for detecting photons of different energy levels.

The ASIC chip 120 receives 128 inputs 202 from the corresponding number of pixels of the CZT detector 102. In addition, the ASIC chip 120 receives a calibration pulse 212, which is applied to all the channels 200, and may be used as a test input for system calibration, for example.

Each channel 200 also receives threshold signals 214 and 216, which are used to program thresholds to be used for counting photons in different bins or windows. In other embodiments, there may be three or more thresholds (e.g., four) such that the PCM detector 100 can provide additional spectroscopic information.

The ASIC chip 120 also receives a serial DAC data and clock 218. For example, such data may be used to provide digital tuning of the DAC adjustment circuitry in each channel 200. The ASIC chip 120 also receives clocks and control signals 220. For example, the control signals may include reset and/or start signals.

The ASIC chip 120 also receives power 206 for its own operation through the contacts 109 from the PCB 112, for example. Also, the ASIC chip 120 receives analog biases 208 at a bias & other control 210, which in turn provides analog biases 222 to the channels 200 of the ASIC chip 120. Except for the channel specific, digitally programmable threshold fine-tune DACs, the biasing of all other analog functions inside a channel is generated by a single bias "generator" unit 210, which is common to all channels (including the biasing of the range of the DACs).

The bias-generator unit 210 is biased (i.e., external biases 208) via external connections, and adjustments of the external biases make changes to the parameters of the amplifier/discriminator chain (e.g., shape, gain, etc.), where all channels may be changed equally. The external biases 208, which may include voltage and current levels, are provided by external circuitry. The external current biases can simply be generated by connecting a resistor of a selected size (or a potentiometer) between the actual chip-node and power ("VDD") or ground ("GND"). The voltage bias includes the differential threshold level for which the natural biasing (setting) would be through an external, digitally programmable DAC.

For example, the table below shows the main design parameters of the ASIC chip 120. Of course, the design parameters may be different in other embodiments.

| Parameter | Unit | Specs | Condition | Comments |
| --- | --- | --- | --- | --- |
| Channel pitch | μm | ~43.6 | | Internally |
| Number of Channels | # | 128 | | |
| Chip Size | mm | ~8 × 5 | | |
| Design pixel (+stray) capacitance | pF | 5 | | |
| Max. Leakage Current/pixel | nA | 50 | @T = room | With higher leakage, AC coupling may be needed |
| Peaking-time | ns | ~50 | Cinp = 5 pF | Defined with delta-pulse input condition |
| Maximum power dissipation per channel | mW | 2 | | |
| Supply voltage | V | 0–2.5 | | 3 × supplies |
| CMOS Process | | IBM 0.25 um | | IBM 6SF |
| x-ray source energy range | kVp | 80–140 | | x-ray range: ~30–120 keV |
| ENC noise (rms.) | elect. | ~600 | Cinp = 5 pF | Ideal test conditions, leakage current not incl. |
| ENC noise (rms.) | keV | ~8 | Cinp = 5 pF | Ideal test conditions, leakage current not incl. |
| Gain | mV/keV | ~8 | | At discriminator stage |
| Threshold spread1* | mV | ~20 | No DAC | |
| Threshold spread2* | mV | ~1 | w/DAC | 5 bit DAC included in each channel |
| Lowest threshold | keV | 30 | | Target, depends on CZT behavior |

-continued

| Parameter | Unit | Specs | Condition | Comments |
|---|---|---|---|---|
| Counter type | | Static-ripple | | No refresh needed |
| Number of bits in counters | # | 16 | | |
| Design counting speed | MHz | 10 | | May be higher |
| Design Readout Mux. Clock speed | MHz | 25 | | May be higher |
| Ext. clock edges | ns | <5 | | |

*Threshold spread in keV will be insignificant for the ASIC inherently, but will increase when sensor is attached due to expected pixel-to-pixel gain-variations in the CZT.

Figure 7:
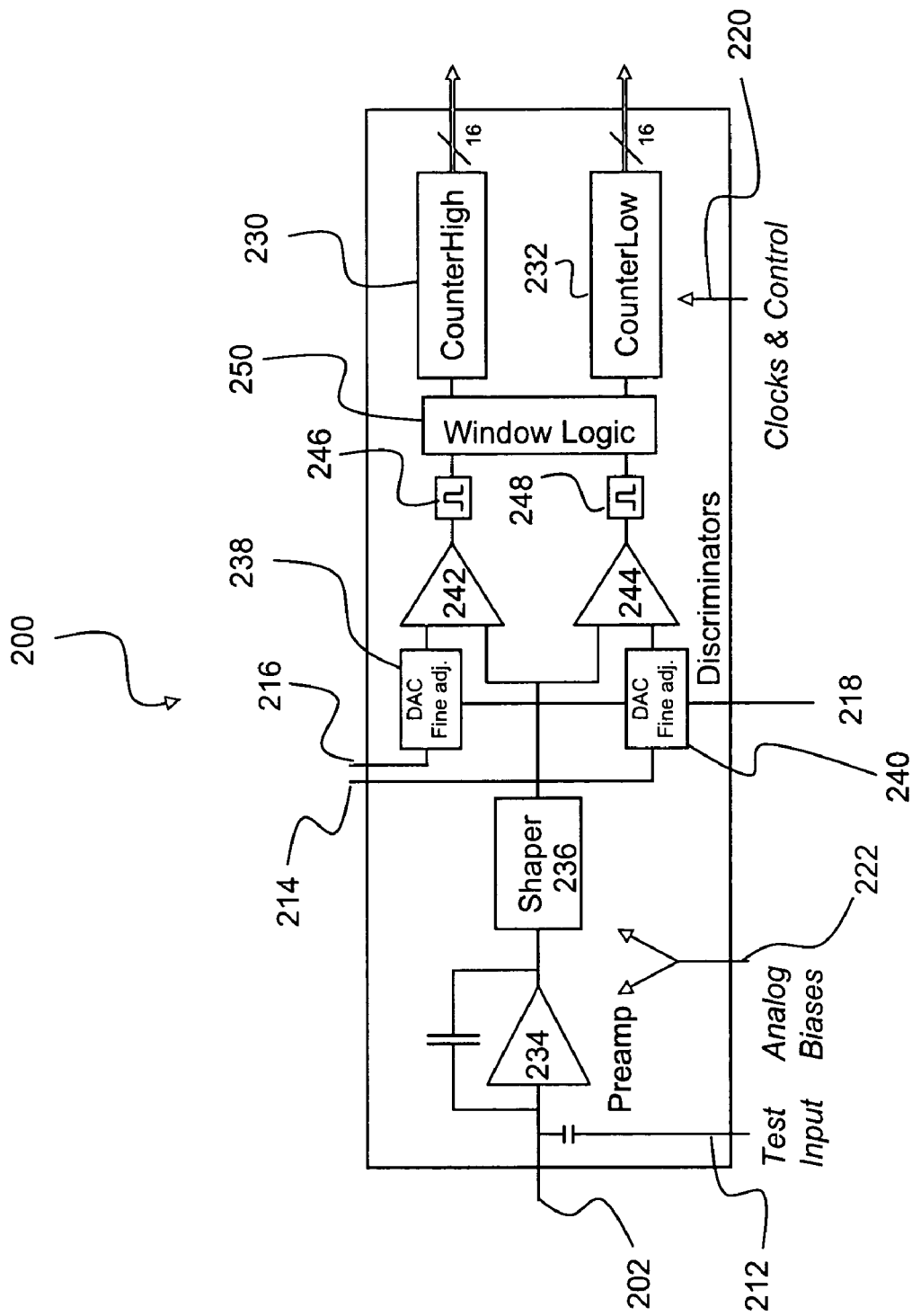
FIG. 7 is a schematic diagram of one of the channels of the readout circuitry of FIG. 6.

Referring now to FIG. 7, the channel 200 includes a pre-amplifier 234 that receives the input signal 202. The pre-amplifier 234 is a charge-sensitive pre-amplifier, for example. The output of the preamplifier 234 is provided to a shaper 236, which is a shaper/gain stage. Analog biases 222 are also applied to the circuitry of the channel 200. The output of the shaper 236 are provided to a pair of discriminators 242 and 244.

The discriminators 242 and 244 are also coupled to discriminator fine-tune DACs 238 and 240, respectively. Using the threshold signals 216 and 214, which may be 5-bit DACs, respectively, the discriminator fine-tune DACs 238 and 240 fine tune the threshold levels of the respective discriminators 242 and 244 individually. The discriminator fine-tune DACs 238 and 240 are programmable through a series shift register (i.e., all DAC registers are linked in a series daisy-chain in the illustrated exemplary embodiment).

In the illustrated exemplary embodiment, the threshold signals 214 and 216 are adjustable. The outputs of the discriminators 242 and 244 are coupled, respectively, to mono-stable "one-shot" devices 246 and 248. Each mono-stable one-shot device is used for clock shaping and window counting logic.

The outputs of the mono-stable one-shot devices 246 and 248 are provided to a window logic 250 for processing, and outputting to counters 230 and 232, respectively. The counter 230 is a high counter for counting higher energy photons, whereas the counter 232 is a low counter for counting lower energy photons. Each of the outputs of the counters 230 and 232 are 16-bit values that are provided to a 16-bit sequential multiplexer 204 of FIG. 6. The readout of the ASIC chip (i.e., dumping of the counters content) is done by reading each channel-counter one after the other in a fixed sequence (e.g., from top to bottom) using the 16-bit sequential multiplexer 204, where all 16 bits of the counter are read out fully in parallel for each channel. The number of counter bits may be different in other embodiments, and accordingly, the sequential multiplexer may be used to read different number of bits.

Figure 8:
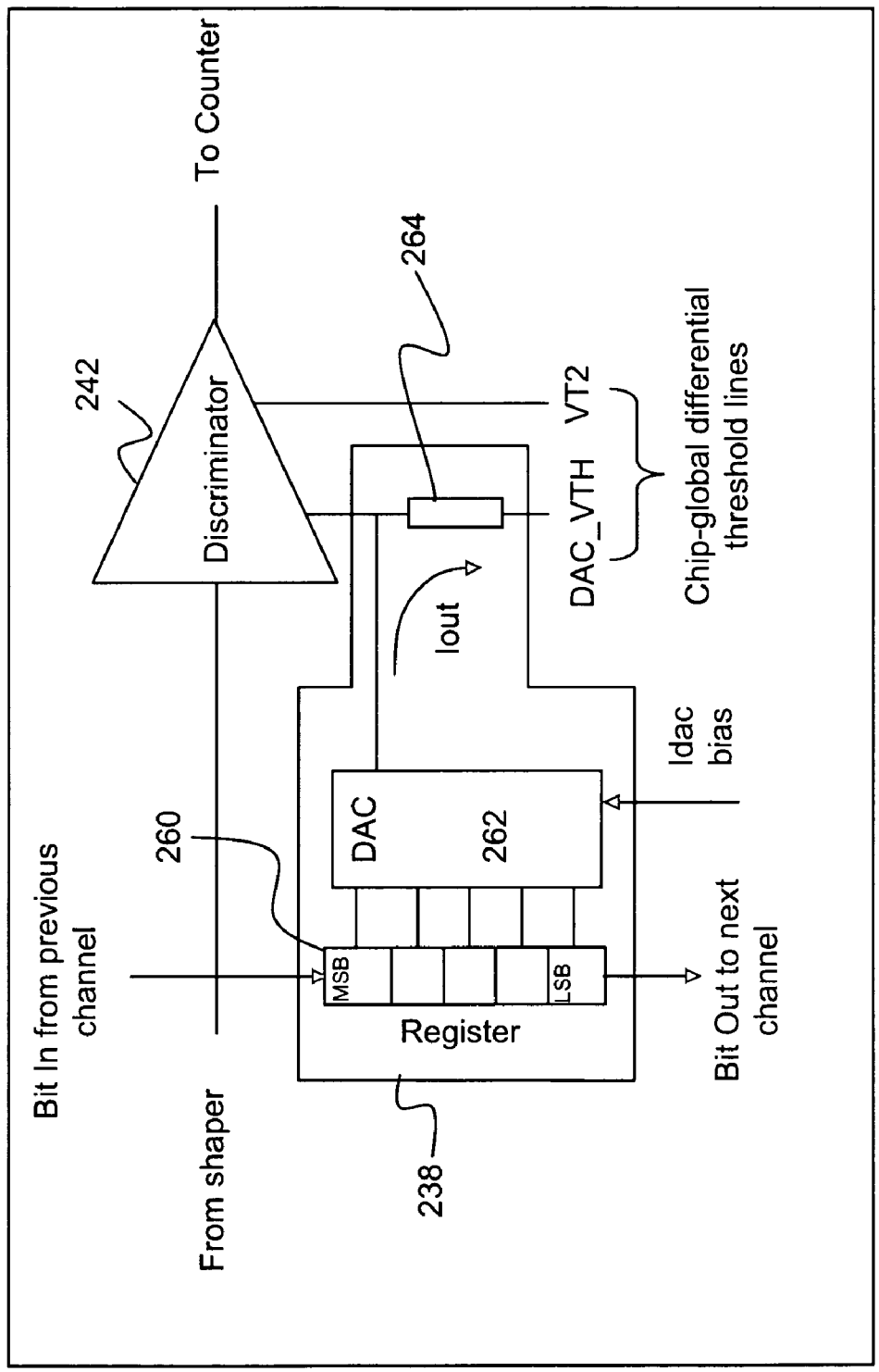
FIG. 8 is a schematic diagram of an adjustable digital-to-analog converter (DAC) of FIG. 7.

Referring now to FIG. 8, in each channel, the discriminator fine tune DAC 238 includes a 5-bit DAC 262 attached between one of the chip-global differential threshold lines and the corresponding threshold input of the discriminator 242 of the given channel. This is done in order to compensate for channel to channel threshold variations caused by process parameter fluctuations. While not shown in FIG. 8, the discriminator fine tune DAC 240 has substantially the same structure as the discriminator fine tune DAC 238.

The discriminator fine tune DAC 238 also includes a 5-bit shift register 260, which receives a bit from the previous channel, and sends a bit out to the next channel. The (individual) DAC 262 voltage adjustment is accomplished by selecting a DC bias-current (Iout) to flow through a resistor 264 and thereby generating a voltage across it. To generate the current Iout, the DAC 262 receives an Idac bias current. In addition to the global threshold level (DAC_VTH), the DAC 262 has at least one of the following two programming options.

First, the DAC adjustment range may be adjusted. The DAC adjustment range is common to all channels and is set externally by adjusting an analog bias. Second, the DAC value within the range may be selected for each channel individually by downloading in series a 5-bit digital word to the memory attached to each DAC.

Figure 9:
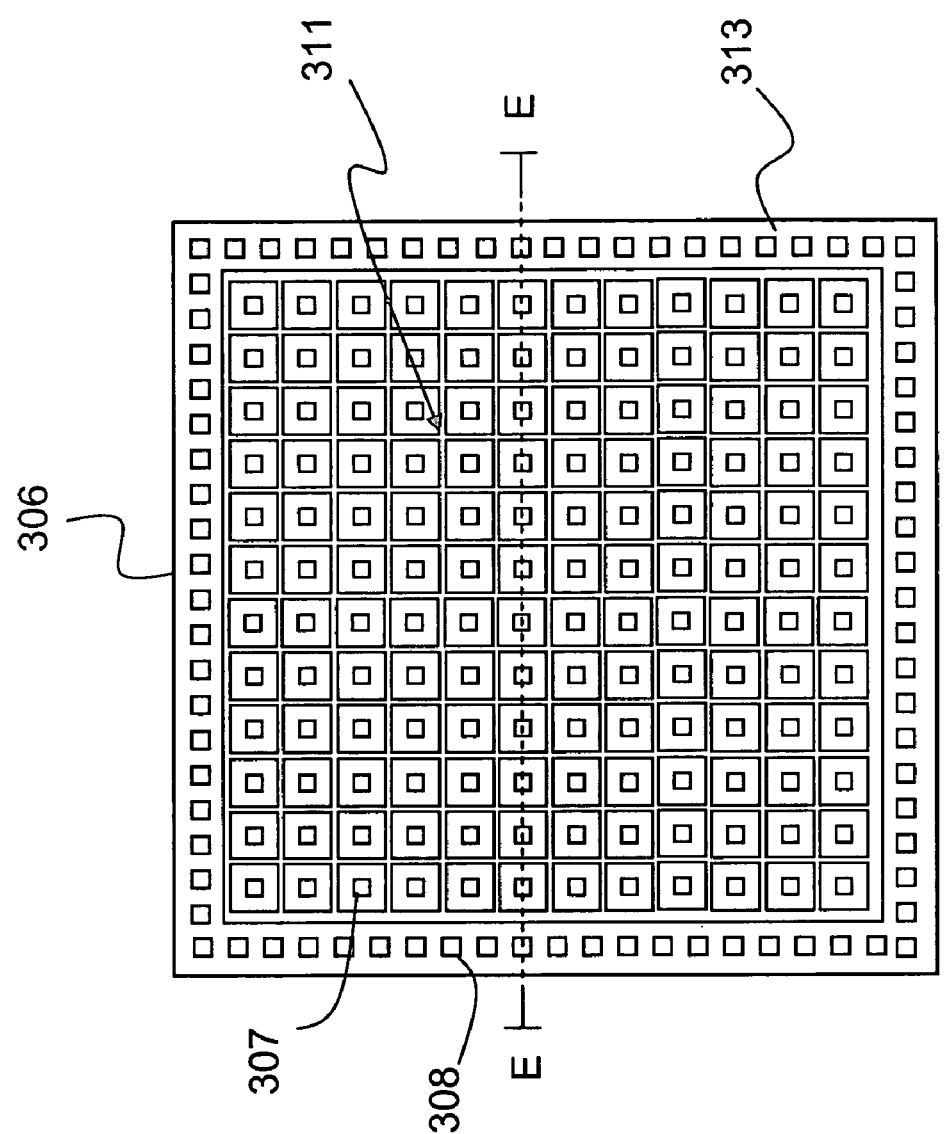
FIG. 9 is a bottom view of an ASIC chip in yet another exemplary embodiment of the present invention.

Referring now to FIG. 9, a bottom view of an ASIC chip 306 having 12×12 (=144) 2D amplifier/counter matrix 311 in yet another exemplary embodiment of the present invention is illustrated. The 2D amplifier/counter matrix 311 is a mirror of a corresponding CZT pixel matrix, but with a smaller pixel size to allow for smaller outer dimensions in order to fit inside of the double-sided BGA package. As such, while the 12×12 amplifier/counter matrix 311 is shown for ease of illustration, the ASIC chip may have more than 144 amplifier/counter circuits to correspond to the number of pixels (e.g., 256, 1024, etc.) in the CZT pixel matrix.

The ASIC chip 306 has formed on its bottom side pads 307 that are used to bump bond the 2D amplifier/counter matrix 311 to electrical pads on a double-sided BGA, for example. Pads 308 at an outer periphery 313 of the ASIC chip 306 are reserved for making external connections through bump bonding using a flip-chip mounting technique as will be described in reference to FIG. 10.

Figure 10:
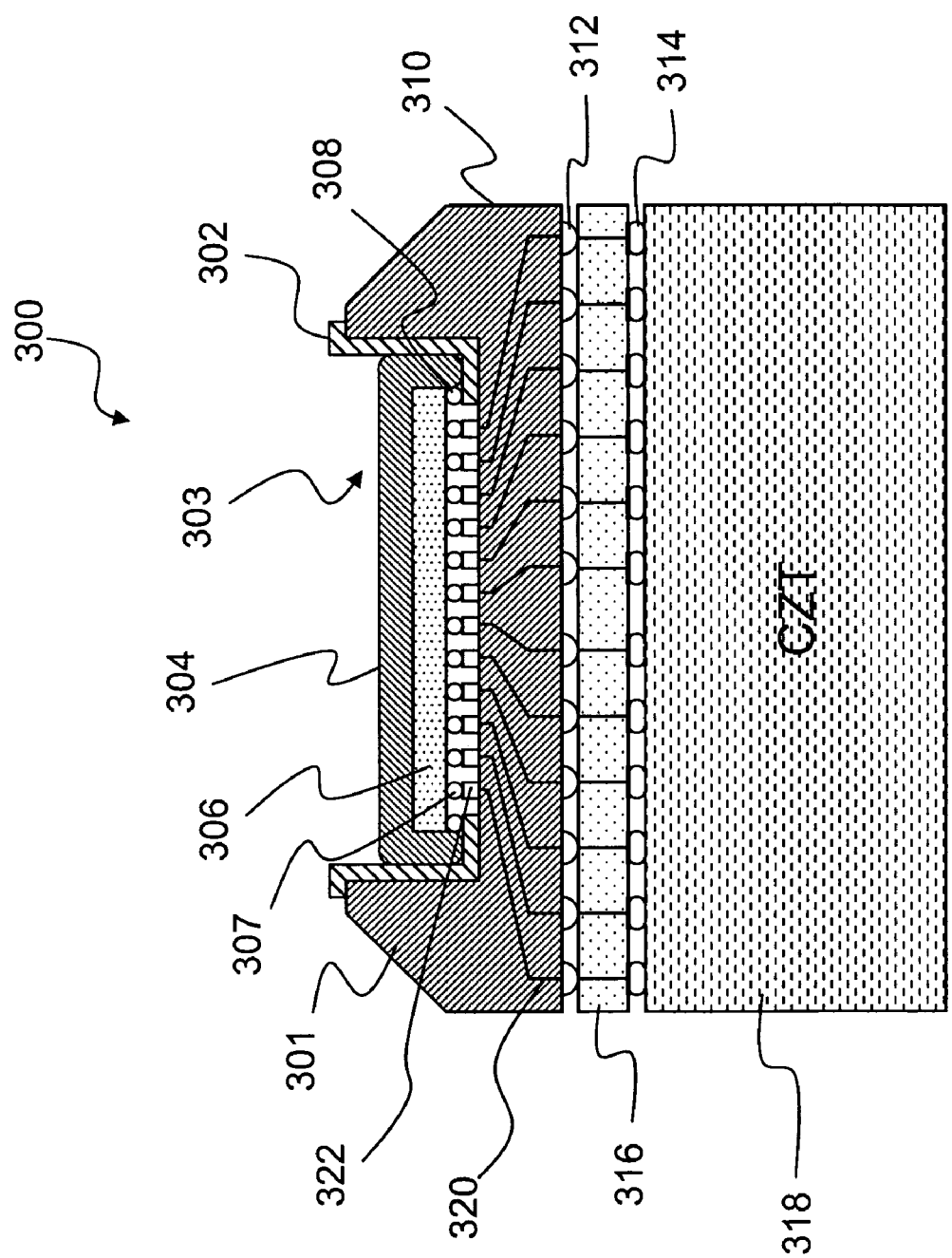
FIG. 10 is a cross sectional view of a PCM detector in yet another exemplary embodiment of the present invention, which shows the ASIC chip of FIG. 9 in cross section, taken along the line E—E.

Referring now to FIG. 10, a PCM detector 300 in yet another exemplary embodiment of the present invention includes a pixelated CZT detector 318. The CZT detector 318 may have a structure similar to that of the CZT detector 102 or the CZT detector 103. As shown, the CZT detector 318 has 12×12 (=144) pixels for ease of illustration, where each pixel has dimensions of approximately 0.5 mm by approximately 0.5 mm. In practice, the CZT detector may have 32×32 (=1024) pixels, each having dimensions of approximately 0.5 mm by approximately 0.5 mm. Further, the number of pixels and the dimensions thereof may be different in still other embodiments.

The pixels of the CZT detector 318 are electrically coupled to solder balls 312 of a double-sided BGA 301 through vias of a ceramic via board 316. The double-sided BGA 301 has 144 solder balls 312 to accommodate the 144 pixels of the CZT detector 318. Of course, 1024 solder balls would be used when the CZT detector has 1024 pixels. The vias are filled with electrically conducting material to carry the electrical detection signals from the CZT detector pixels to the solder balls. Electrically conductive polymers 314 are used to attach the ceramic via board 316 to the CZT detector 318.

Internal wirings 320 embedded in the double-sided BGA 301 are used to carry the electrical detection signals to electrical pads 322 that are used to interface with flip-chip bumps 307 for electrically coupling the CZT detector 318 with the ASIC chip 306 using a flip-chip mounting technique.

The ASIC chip 306 is mounted in a cavity 303 of the ASIC chip 306. As shown, the ASIC chip 306 has 144 channels to provide readout circuitry to each of the 144 pixels of the CZT detector 318. The double-sided BGA 301 has also formed thereon a number of external connection contacts 302 for I/O interface and power. The ASIC chip is also flip-chip bonded to the external connection contacts 302 using the bump pads 308 on the external periphery 313 of the ASIC chip 306. Optionally, the ASIC chip 306 may be protected by filling the cavity 303 with glob, plastic or other suitable material 304 on top of the ASIC chip 306.

Figure 11:
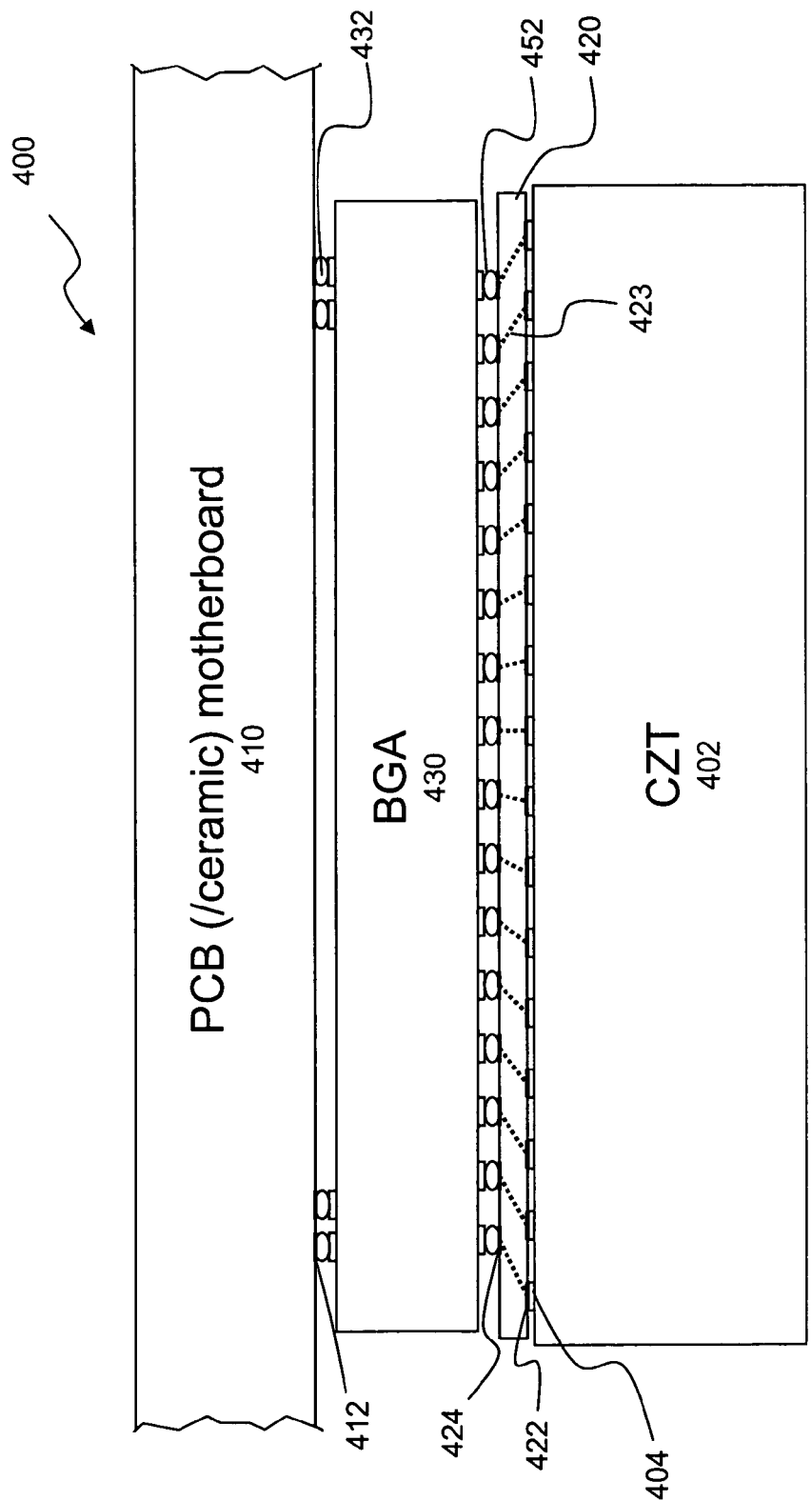
FIG. 11 is a somewhat diagrammatic view of a PCM detector in yet another exemplary embodiment of the present invention.

Referring now to FIG. 11, a PCM detector 400 in yet another exemplary embodiment of the present invention includes a CZT detector 402, which may have 16×16 pixels, for example, for pixelated detection of radiation (e.g., x-rays). The CZT detector 402, for example, may be substantially the same as the CZT detector 102 of FIGS. 1 and 4A–4E or may be any other suitable CZT detector as described herein. By way of example, the CZT detector 402 may be the same as the CZT detector 103 of FIGS. 5A–5E, or alternatively, have a configuration and operational characteristics that are similar to or substantially the same as that of the CZT detector 318 of FIG. 10, which has pixels having dimensions of approximately 0.5 mm by approximately 0.5 mm.

Each pixel of the CZT detector 402 is coupled to a corresponding one of solder balls (recipient electrode) 452 of a double-sided BGA 430 through a pitch adapter board 420, which allows the double-sided BGA 430 and the CZT detector 402 having different pitches to be coupled to each other. The pitch adapter board 420, may, for example, be a PCB made of ceramic. The CZT detector 402 has a plurality of CZT electrodes 404 for coupling the CZT detector 402, pixel by pixel, to terminals 422 on one side (i.e., the bottom side as shown in FIG. 11) of the pitch adapter board 420. The CZT electrodes 404 may be formed of conductive epoxy, for example, or any other suitable material.

The terminals 422 are connected to terminals 424 on the other side (i.e., the top side as shown in FIG. 11) of the pitch adapter board 420 via PCB leads 423 that are embedded in the pitch adapter board 420. The PCB leads 423 are shown as dotted lines because they ordinarily would not be visible without cutting through the pitch adapter board 420. The terminals 424 of the pitch adapter board 420 are coupled, pixel by pixel, to solder balls 452 formed on the bottom side (as shown in FIG. 11) of the double-sided BGA 430. The double-sided BGA 430 also has rows of solder balls 432 that are formed on its top side (as shown in FIG. 11) for connecting with a PCB 410, which is a motherboard that may be made of ceramic. The rows of solder balls formed on the top side of the double-sided BGA 430 will be described below in reference to FIG. 12. The PCB 410 has terminals 412 for coupling to the solder balls 432 so as to form electrical connection therewith. As will be described below in reference to FIGS. 12, 13A and 13B, the double-sided BGA 430 has one or more ASICs mounted therein. The ASICs include channels containing readout circuitry for each pixel of the CZT detector 402.

Figure 12:
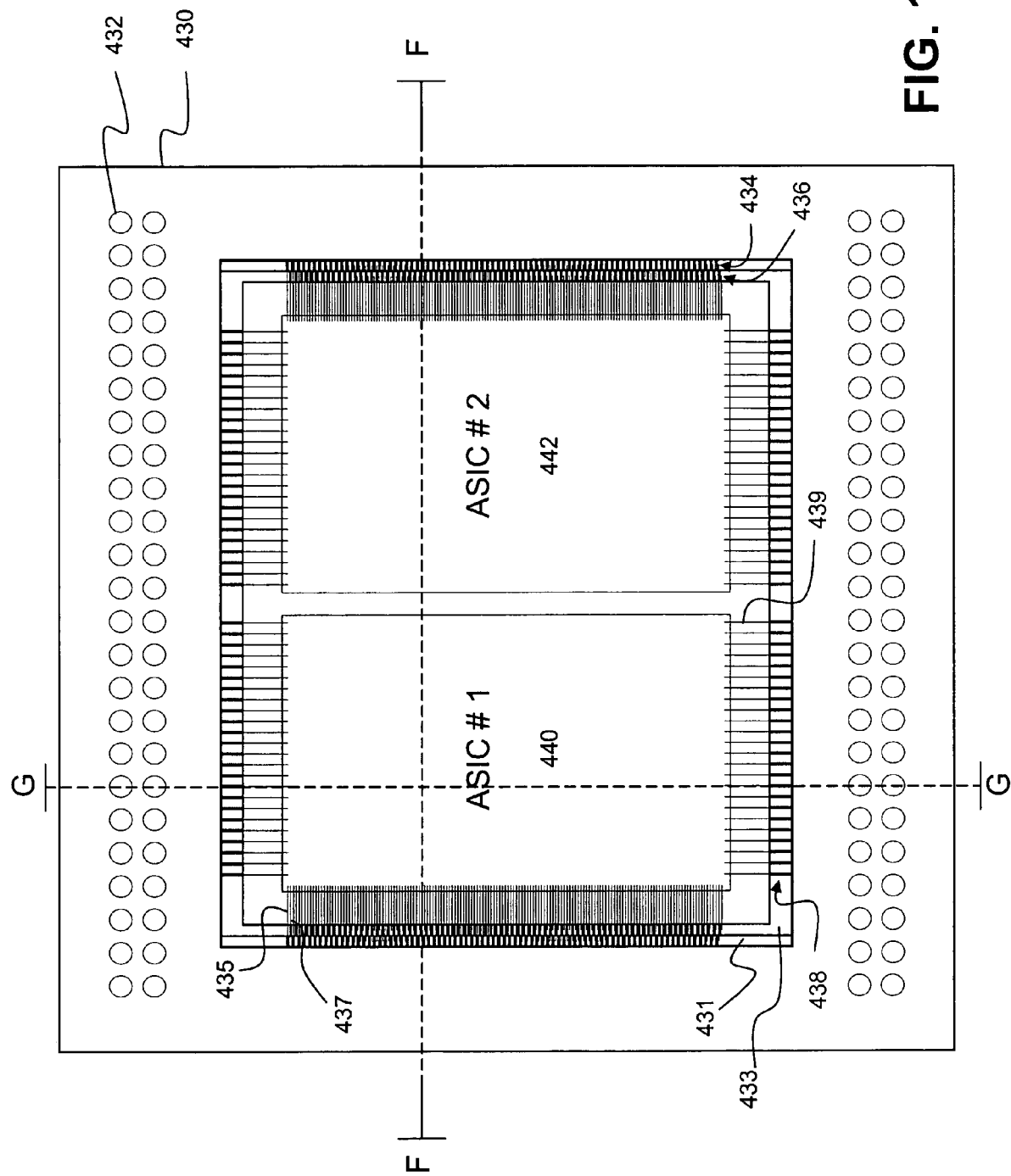
FIG. 12 is a top view of a double-sided ball grid array in the PCM detector of FIG. 11.

Referring now to FIG. 12, the double-sided BGA 430 has mounted therein a pair of ASIC chips 440 and 442. By way of example, the double-sided BGA 430 may have dimensions of approximately 16 mm×approximately 16 mm and a height of approximately 2 mm. The dimensions of the double-sided BGA may be different in other embodiments, however, they generally should not exceed 16 mm in either horizontal or vertical direction. While the height is not critical, a thicker package may be more suitable if it can reduce the inter-capacitance of the leads on the bottom side.

The double-sided BGA 430 has a terminal rim structure around its inner periphery where the terminal rim has a single level 433 in horizontal direction, and the terminal rim structure has a dual level where a second level terminal rim 431 is provided in addition to the level 433. This way, the leads can be staggered and a pitch of approximately 120 $\mu$m/2 (=60 $\mu$m) can be realized.

In more detail, in the horizontal direction, leads 438 (i.e., bonding pads) are formed on the single level terminal rim 433 for electrically coupling the ASIC chips 440, 442 to the solder balls 432 of the double-sided BGA 430 via wires 439. Further, in the vertical direction, leads 436 are formed on the first level (which is the same level as the single level in the horizontal direction) terminal rim 433 for electrically coupling the ASIC chips 440, 442 to the solder balls 452 of the double-sided BGA 430 via wires 437, and leads 434 are formed on the second level terminal rim 431 for electrically coupling the ASIC chips 440, 442 to the solder balls 452 of the double-sided BGA 430 via wires 435.

On the horizontal sides having only the single level terminal rim 433, the wires 439 coupled between the leads 438 and the ASIC chips 440, 442 have a regular pitch of approximately 120 $\mu$m, for example. However, on the vertical sides having a dual level terminal rim (i.e., the first level terminal rim 433 and the second level terminal rim 431), the wiring leads 436 and 434 are staggered with respect to each other such that twice as many leads can be placed as compared with the case of using a single level terminal rim. By way of example, the pitch of the leads/wires on the staggered sides of the double-sided BGA may be approximately 60 $\mu$m.

The readout circuitry implemented in the ASIC chips 440 and 442, which are based on CMOS technology, allows for placing one or more of a charge-sensitive preamplifier, shaping amplifier, multiple energy level discriminators, and digital event counters for each pixel in the array, all within an area which is less than or equal to the geometric area of each pixel in the CZT detector 402. By incorporating the detector and photon counting electronics in each pixel of the detector system, high photon rates typical of clinical applications can be handled. The readout circuitry in the ASIC chips 440 and 442 can be substantially the same as the readout circuitry in the ASIC chips 120 and 122 of FIG. 2, for example.

Each of the ASIC chips 440 and 442 has formed thereon 128 channels of readout circuitry such that two ASIC chips together can provide readout circuitry to each of the 256 (i.e., 16×16) pixels of a CZT detector 402 of FIG. 11. In other embodiments, all 256 channels of the readout circuitry may be formed on a single ASIC chip. In still other embodiments, different number of channels may be formed on one or more ASIC chips to accommodate a CZT and/or other suitable PCM detector material having a different number of pixels (e.g., 1024 pixels).

By way of example, the dimensions of the double-sided BGA 430 in the illustrated exemplary embodiment can be approximately 16 mm by approximately 16 mm. Also, each of the ASIC chips can be approximately 5 mm in width and approximately 8 mm in length, and be mounted side by side widthwise on the double-sided BGA 430, such that the total width of the area occupied by the ASIC chips including the space therebetween is slightly more than approximately 10 mm. In other embodiments, the double-sided BGA and/or the ASIC chips may have different dimensions.

Figure 13A:
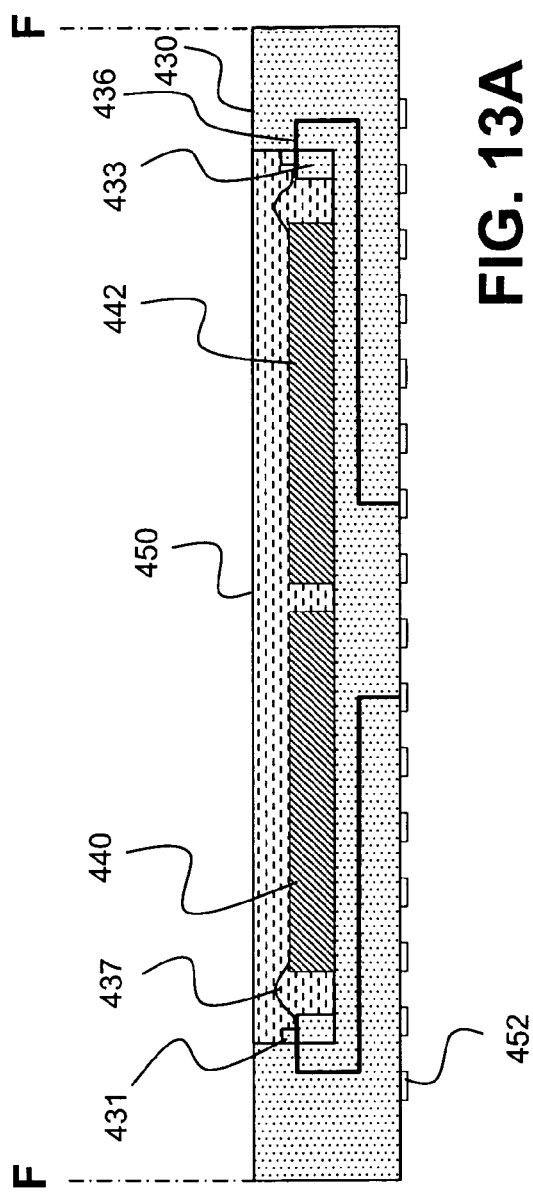
FIGS. 13A and 13B are cross sectional views of the double-sided ball grid array of FIG. 12, taken along the lines F—F and G—G, respectively.

Referring now to FIG. 13A, the ASIC chips 440 and 442 are mounted in the double-sided BGA 430. As can be seen in the cross-section along the line F—F of FIG. 12, the double-sided BGA 430 has a two level terminal rim including first and second level rims 433 and 431 in the vertical direction. The ASIC chips 440 and 442 are electrically coupled to the solder balls 452 on the bottom side of the double-sided BGA 452 via the wires 437 and the wiring leads 436 on the first level terminal rim 433 and via the wires 435 and the wiring leads 434 on the second level terminal rim 431. This way, the solder balls 452 are electrically coupled to the readout circuitry on the ASIC chips 440, 442 via wires 435, 437 that may have been formed, for example, using a wire bonding technique, and the leads 434, 436. It should be noted that the wiring leads 434 mounted on the second level terminal rim 431 and the wires 435 are not shown in the cross-sectional diagram of FIG. 13A because of the staggered nature of the wiring leads 434 and 436.

Figure 13B:
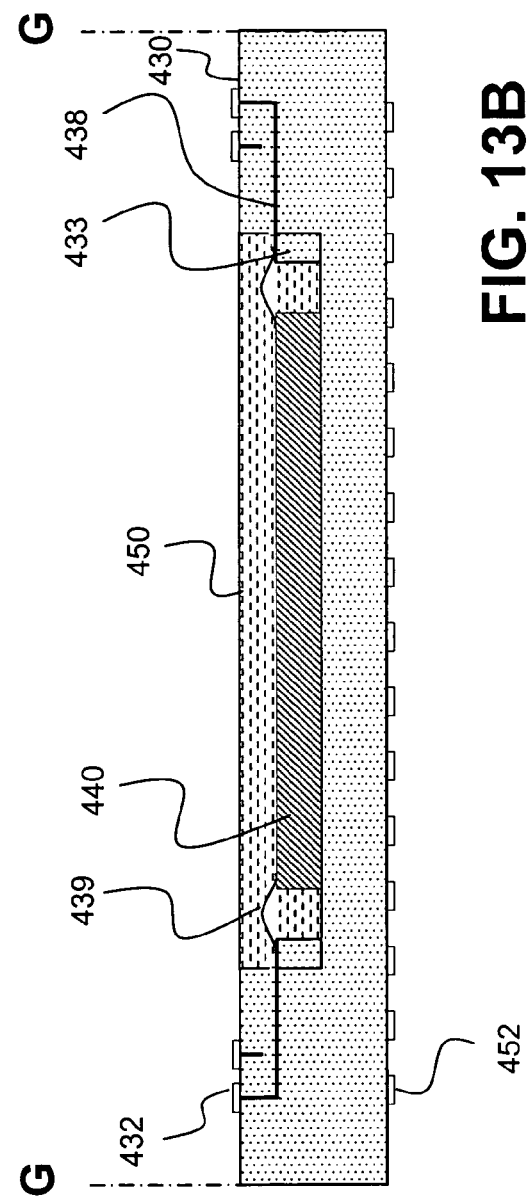

Referring now to FIG. 13B, the cross-sectional diagram of the cross-section taken along the line G—G shows only the ASIC chip 440. It should be noted, however, that the ASIC chip 442 is coupled in substantially the same manner as the ASIC chip 440. The ASIC chip 440 is connected to the solder balls 432 on the top side of the double-sided BGA 430 through the wires 439 and the wiring leads 438 mounted on the single level terminal rim 433 formed along the inner edge of the double-sided BGA 430 in the horizontal direction. The wires 439, for example, are formed using wirebonding technique. Since the solder balls 452 are used to interface with the CZT detector, the solder balls 432 provided on the top side of the double-sided BGA 430 are used to couple the ASIC chips 440, 442 to carry the signals between the ASICS 440 and 442 and external interfaces (I/O, power, etc.) on the PCB 410, for example.

It can be seen in FIGS. 13A and 13B, the cavity of the double-sided BGA 430 in which the ASIC chips 440 and 442 are mounted, is filled with a filling material 450. The filling material 450 may, for example, include glob, plastic or other suitable material.

It will be appreciated by those of ordinary skill in the art that the present invention can be embodied in other specific forms without departing from the spirit or essential character hereof. The present description is therefore considered in all respects to be illustrative and not restrictive. The scope of the invention is indicated by the appended claims, and all changes that come within the meaning and range of equivalents thereof are intended to be embraced therein.

For example, while the present invention has been described with reference to certain exemplary embodiments based on CZT detectors, other suitable semiconductor materials, such as gallium arsenide (GaAs), Cadmium Telluride (CdTe), mercuric iodide (HgI2), or the like in polycrystalline form and/or crystalline form may be used as detector material in other embodiments. Also, the present invention is not limited to the detection of x-rays, but the principles of the present invention is broadly applicable to detection of any radiation including, without limitation, alpha rays, beta rays, gamma rays, and the like.

What is claimed are:

1. A radiation detector comprising:
   a detector having a plurality of pixels, each of the pixels for detecting radiation;
   a package having a first side and a second side that oppose each other, and having:
      a plurality of solder balls formed on the first side;
      a plurality of electrical contacts formed on the second side; and
      a cavity containing at least one integrated circuit (IC) chip having a plurality of readout channels;
      each of the readout channels being coupled to a corresponding one of the pixels via a corresponding one of the solder balls to receive an electrical signal corresponding to the radiation detected by the corresponding one of the pixels,
   wherein the electrical contacts on the second side of the package are electrically coupled to respective ones of the readout channels of the at least one IC chip to interface the at least one IC chip with external devices.

2. The radiation detector of claim 1, wherein the detector comprises cadmium zinc telluride (CZT) material or cadmium telluride (CdTe) material.

3. The radiation detector of claim 1, wherein the package has a terminal rim around the cavity, wherein the terminal rim includes a first level terminal rim having a plurality of first leads mounted thereon and a second level terminal rim having a plurality of second leads mounted thereon, wherein the first leads and the second leads are staggered such that the first leads are not aligned with the second leads.

4. The radiation detector of claim 1, wherein the detector has formed thereon a plurality of electrodes used for coupling its pixels to the solder balls of the package.

5. The radiation detector of claim 4, wherein each of the electrodes comprises conductive epoxy.

6. The radiation detector of claim 1, wherein the pixels of the detector are coupled with the solder balls of the package via an interface board.

7. The radiation detector of claim 6, wherein the interface board comprises a ceramic or fiber glass board having a plurality of via holes formed therethrough for electrically coupling the pixels to the solder balls.

8. The radiation detector of claim 6, wherein a pitch of the pixels is different from a pitch of the solder balls, and wherein the interface board comprises an adapter board for interfacing between the detector and the package having different pitches.

9. The radiation detector of claim 1, wherein the radiation detector is a photon counting mode detector capable of counting individual photons detected at each of the pixels.

10. The radiation detector of claim 1, wherein the detector provides a small pixel effect, which allows for obtaining a signal corresponding to a detected radiation faster than a drift time of free charges generated by the detected radiation in the detector.

11. The radiation detector of claim 1, wherein the detector includes a drift structure in each of the pixels so as to improve a response time.

12. The radiation detector of claim 11, wherein the drift structure includes a metal trace formed around a periphery of each of the pixels.

13. The radiation detector of claim 1, wherein the plurality of electrical contacts formed on the second side include a plurality of solder balls.

14. The radiation detector of claim 1, wherein the plurality of electrical contacts formed on the second side include at least one row of electrical contacts.

15. The radiation detector of claim 1, wherein each of the readout channels includes one or more selected from a charge-sensitive preamplifier, a shaping amplifier, an energy level discriminator and a digital event counter.

16. The radiation detector of claim 1, wherein the electrical contacts on the second side of the package are used to interface with a PCB for input/output and power interfaces with the external devices.

17. The radiation detector of claim 1, further comprising glob which is applied to the cavity after the at least one IC chip is mounted in the cavity.

18. The radiation detector of claim 1, wherein the radiation comprises x-rays, and the detector converts the x-rays to the electrical signal.

19. The radiation detector of claim 1, wherein the radiation detector is capable of counting photons of the radiation that have a particular energy level or an energy level that falls within a particular range of energy levels for at least one of the pixels of the detector.

20. The radiation detector of claim 1, wherein the radiation detector is capable of counting photons of the radiation having at least two different energy levels or at least two different ranges of energy levels.

21. A method of detecting and processing radiation using a radiation detector including a detector having a plurality of pixels, and a package having a plurality of solder balls formed on one side, a plurality of electrical contacts formed on an opposing side, and a cavity containing at least one integrated circuit (IC) chip having a plurality of readout channels, the method comprising:
    detecting radiation in each of the pixels of the detector;
    inducing electrical signals in the readout channels of the at least one IC chip in response to the radiation, wherein the pixels and the readout channels of the at least one IC chip are electrically coupled via the solder balls formed on the one side of the package, each of the readout channels processing the electrical signals corresponding to one of the pixels; and
    providing information concerning the radiation detected in the pixels from the at least one IC chip to a PCB through the electrical contacts formed on the opposing side of the package, the electrical contacts being electrically coupled to the at least one IC chip.

22. The method of claim 21, wherein the pixels of the detector are electrically coupled with the solder balls of the package via an interface board.

23. The method of claim 22, wherein the interface board comprises a ceramic or fiber glass board having a plurality of via holes formed therethrough for electrically coupling the pixels to the solder balls.

24. The method of claim 22, wherein a pitch of the pixels is different from a pitch of the solder balls, wherein the interface board comprises an adapter board for interfacing between the detector and the package having different pitches.

25. The method of claim 21, wherein the processing by each of the readout channels includes one or more selected from pre-amplifying, shaping, multiple energy level discriminating and event counting of the electrical signals corresponding to the radiation.

26. The method of claim 21, wherein the radiation detector operates in a photon counting mode, wherein individual photons are detected and counted.

27. A photon counting mode (PCM) detector for detecting and counting photons, the PCM detector comprising:
    a detector having a plurality of pixels, wherein speed of counting the photons is improved through a small pixel effect; and
    a chip package having:
        a cavity containing at least one integrated circuit (IC) chip, each having one or more readout channels, each of the readout channels being coupled to a corresponding one of the pixels;
        a plurality of first electrical contacts formed on a first side of the chip package, for electrically coupling the at least one IC chip to the pixels; and
        a plurality of second electrical contacts formed on a second side of the chip package opposing the first side, for electrically coupling the at least one IC chip to an external device.

28. The PCM detector of claim 27, wherein the small pixel effect allows for obtaining a detection signal faster than a drift time of free charges generated by a detected radiation in the detector.

29. The PCM detector of claim 27, wherein the detector comprises a pixelated cadmium zinc telluride (CZT) detector or a cadmium telluride (CdTe) detector.

30. The PCM detector of claim 27, wherein the detector includes a drift structure in each of the pixels so as to improve a response time.

31. The PCM detector of claim 30, wherein the drift structure includes a metal trace formed around a periphery of each of the pixels.

32. The PCM detector of claim 27, wherein the chip package comprises a double-sided package having a plurality of solder balls as the first electrical contacts, and wherein the second electrical contacts electrically couple the at least one IC chip to the external device via a PCB.

33. The PCM detector of claim 32, wherein the plurality of second electrical contacts formed on the second side comprises a plurality of solder balls.

34. A photon counting mode (PCM) detector for detecting and counting photons, the PCM detector comprising:
    a detector having a plurality of pixels, wherein a size of each pixel is smaller than a thickness of the detector; and
    a chip package having:
        a cavity containing at least one integrated circuit (IC) chip, each having one or more readout channels, each of the readout channels being coupled to a corresponding one of the pixels;
        a plurality of first electrical contacts formed on a first side of the chip package, for electrically coupling the at least one IC chip to the pixels; and
        a plurality of second electrical contacts formed on a second side of the chip package opposing the first side, for electrically coupling the at least one IC chip to an external device.

35. The PCM detector of claim 34, wherein a ratio between the size of each pixel and the thickness of the detector is about 0.3.

36. The radiation detector of claim 1, wherein the electrical contacts on the second side of the package are electrically coupled to the at least one IC chip via wire bonding.

37. The radiation detector of claim 1, wherein substantially the entire area of each of the pixels is adapted to detect the radiation of a same wavelength.

* * * * *